(12) United States Patent
Hayashi et al.

(10) Patent No.: US 7,361,983 B2
(45) Date of Patent: Apr. 22, 2008

(54) SEMICONDUCTOR DEVICE AND SEMICONDUCTOR ASSEMBLY MODULE WITH A GAP-CONTROLLING LEAD STRUCTURE

(75) Inventors: Kenichi Hayashi, Tokyo (JP); Hisashi Kawafuji, Fukuoka (JP); Junichi Murai, Tokyo (JP); Goro Izuta, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/625,583

(22) Filed: Jul. 24, 2003

(65) Prior Publication Data

US 2004/0145043 A1    Jul. 29, 2004

(30) Foreign Application Priority Data

Jul. 26, 2002    (JP)    ............... 2002-218681

(51) Int. Cl.
| | |
|---|---|
| H01L 23/48 | (2006.01) |
| H01L 23/495 | (2006.01) |
| H01L 23/34 | (2006.01) |
| H05K 3/30 | (2006.01) |

(52) U.S. Cl. .............. 257/696; 257/E23.043; 257/E23.052; 257/E23.092; 257/676; 257/666; 257/698; 257/690; 257/691; 257/693; 257/776; 257/775; 361/774; 361/748; 361/776; 439/75

(58) Field of Classification Search ........ 257/E23.043, 257/E23.052, E23.092, 690–693, 696, 698, 257/676, 776, 775, 787, 666; 361/774, 748, 361/761, 776, 405; 439/75; 228/180; 174/52.4
See application file for complete search history.

(56) References Cited

U.S. PATENT DOCUMENTS 3,418,535 A * 12/1968 Martinell ................. 361/805

(Continued)

FOREIGN PATENT DOCUMENTS

JP    54-103158    12/1977

(Continued)

OTHER PUBLICATIONS

Translation of Takayoshi Togawa, title "Printed Circuit Board". May 15, 1989, JP 01122579A.*

(Continued)

*Primary Examiner*—Alexander O Williams
(74) *Attorney, Agent, or Firm*—Oblon, Spivak, McClelland, Maier & Neustadt, P.C.

(57) ABSTRACT

In a semiconductor device (1), semiconductor elements (2) and (3) are mounted on a lead frame (5) having leads (4). The semiconductor elements (2) and (3) are connected with the leads (4) by metallic wires (6) and (7). The semiconductor device (1) also has a heat sink (8). The members (2) to (8) are sealed with a plastic package (10). The leads (4) are exposed outward. Each of the end leads (4a) to (4d) has a wide first lead portion, a narrow second lead portion, a third lead portion to be inserted into an external substrate, and a protruding gap-controlling portion (9) for keeping the gap between the semiconductor device (1) and the external substrate constant. Because the heat resistance from the leads (4) to the plastic package (10) increases, the temperature-rise property of the lead is improved so that the solderability is improved.

19 Claims, 17 Drawing Sheets

U.S. PATENT DOCUMENTS

| | | | |
|---|---|---|---|
| 3,825,876 A * | 7/1974 | Damon et al. | 439/70 |
| 3,989,331 A * | 11/1976 | Hanlon | 439/70 |
| 4,246,627 A * | 1/1981 | Poensgen | 361/773 |
| 4,680,613 A * | 7/1987 | Daniels et al. | 257/670 |
| 5,096,425 A | 3/1992 | Takahashi | |
| 5,166,570 A * | 11/1992 | Takahashi | 310/320 |
| 5,398,165 A * | 3/1995 | Niinou | 361/774 |
| 5,508,563 A * | 4/1996 | Tazawa et al. | 257/773 |
| 6,225,683 B1 * | 5/2001 | Yalamanchili et al. | 257/666 |
| 6,255,722 B1 * | 7/2001 | Ewer et al. | 257/676 |
| 6,476,481 B2 * | 11/2002 | Woodworth et al. | 257/696 |
| 6,512,185 B2 * | 1/2003 | Itou | 174/260 |
| 6,541,702 B2 * | 4/2003 | Miyaki et al. | 174/52.4 |
| 6,551,858 B2 * | 4/2003 | Kawata et al. | 438/109 |
| 6,585,149 B2 * | 7/2003 | Nakatsuka et al. | 228/180.1 |
| 6,667,547 B2 * | 12/2003 | Woodworth et al. | 257/696 |
| 6,849,805 B2 * | 2/2005 | Honda et al. | 174/250 |
| 2002/0102763 A1 * | 8/2002 | Masuda et al. | 438/64 |
| 2002/0179690 A1 * | 12/2002 | Kawashima et al. | 228/207 |
| 2003/0011051 A1 * | 1/2003 | Woodworth et al. | 257/666 |
| 2003/0062604 A1 * | 4/2003 | Uebayashi et al. | 257/666 |
| 2003/0079911 A1 * | 5/2003 | Bogursky et al. | 174/267 |
| 2003/0174481 A1 * | 9/2003 | Matsuura et al. | 361/767 |
| 2003/0178711 A1 * | 9/2003 | Honda et al. | 257/676 |
| 2004/0026515 A1 * | 2/2004 | Rumsey | 235/487 |

FOREIGN PATENT DOCUMENTS

| | | | |
|---|---|---|---|
| JP | 58-182438 | | 12/1983 |
| JP | 61-174656 | | 8/1986 |
| JP | 62-200749 | | 9/1987 |
| JP | 63-166254 | | 7/1988 |
| JP | 63-244659 | | 10/1988 |
| JP | 1-122579 | * | 5/1989 |
| JP | 1-207961 | * | 8/1989 |
| JP | 2001-196532 | | 7/2001 |
| JP | 2001-257303 | | 9/2001 |
| JP | 2002-373713 | * | 12/2002 |
| JP | 2003-264364 | * | 9/2003 |
| JP | 2003-264365 | * | 9/2003 |

OTHER PUBLICATIONS

Translation of Takehiro Saita, title "Semiconductor Device", filed Jul. 9, 1988, JP63-166254 A.*

* cited by examiner

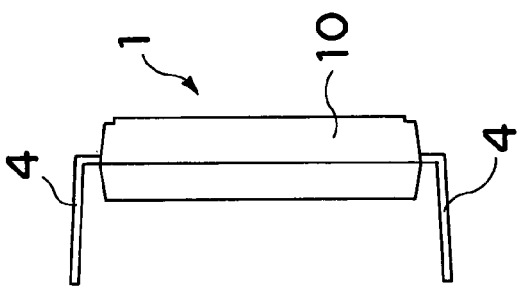
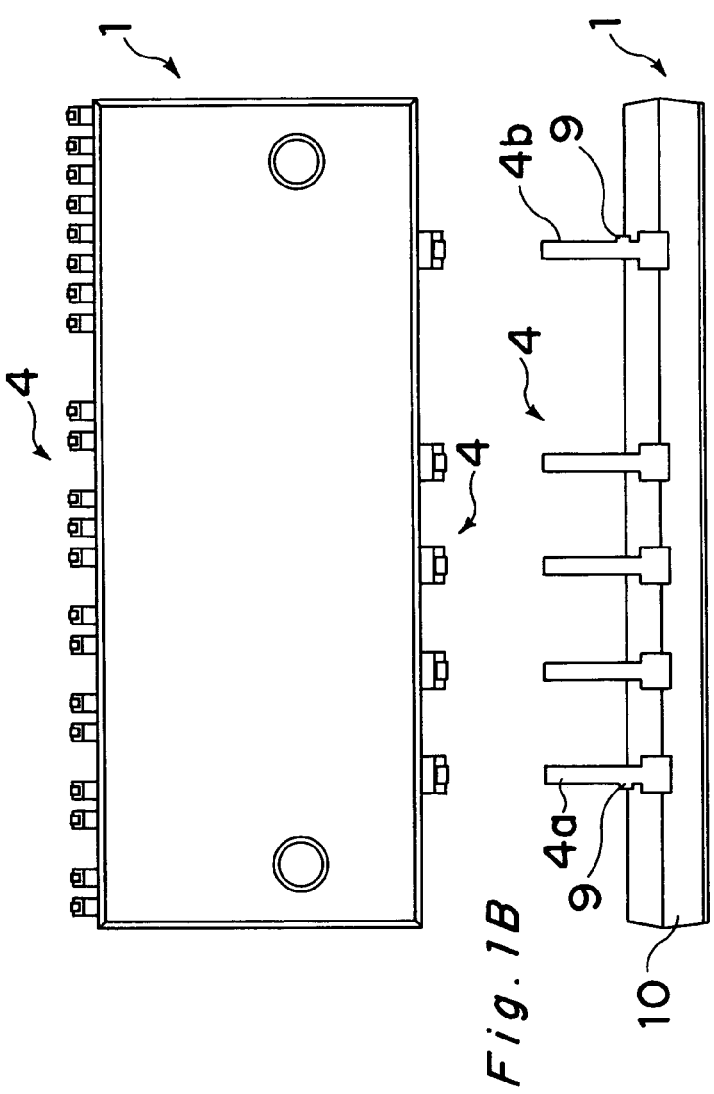
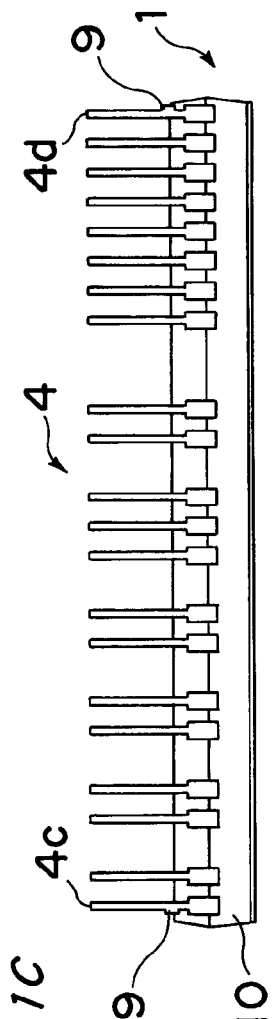

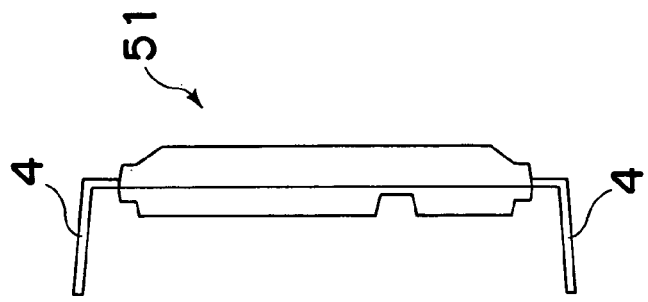
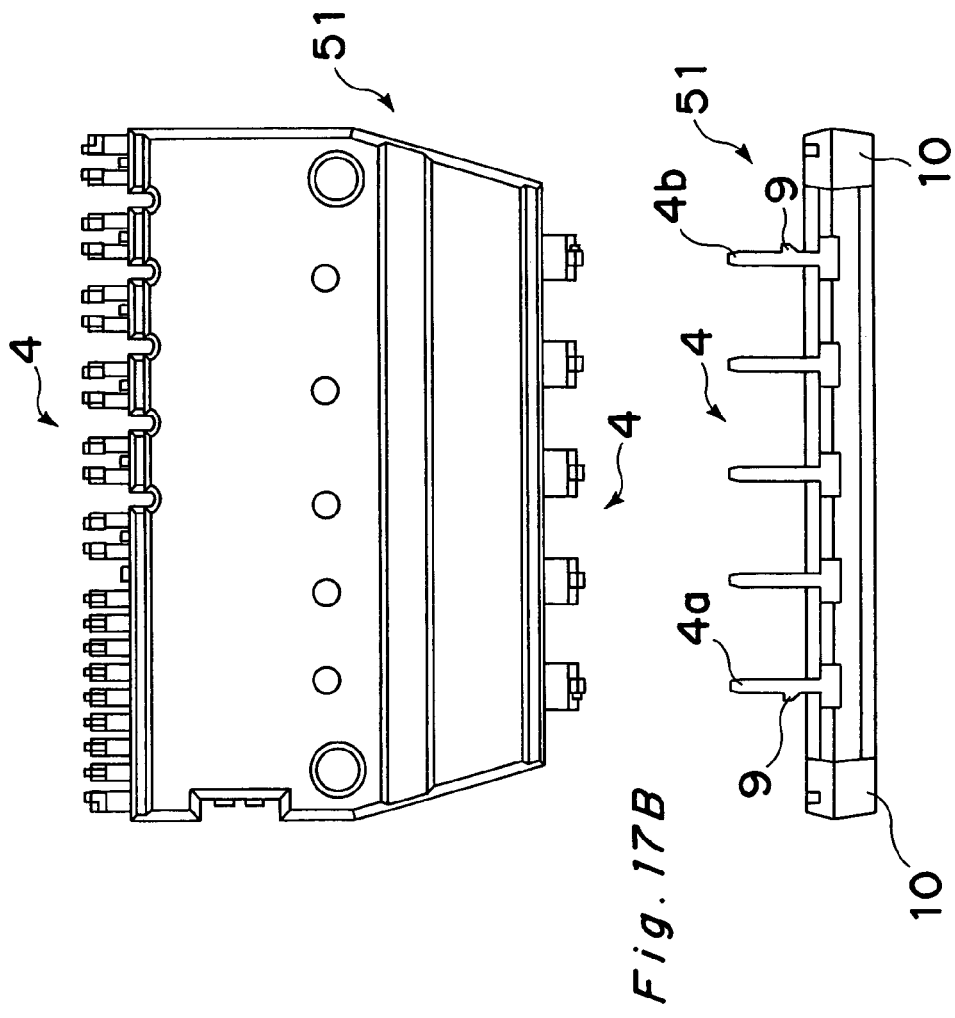

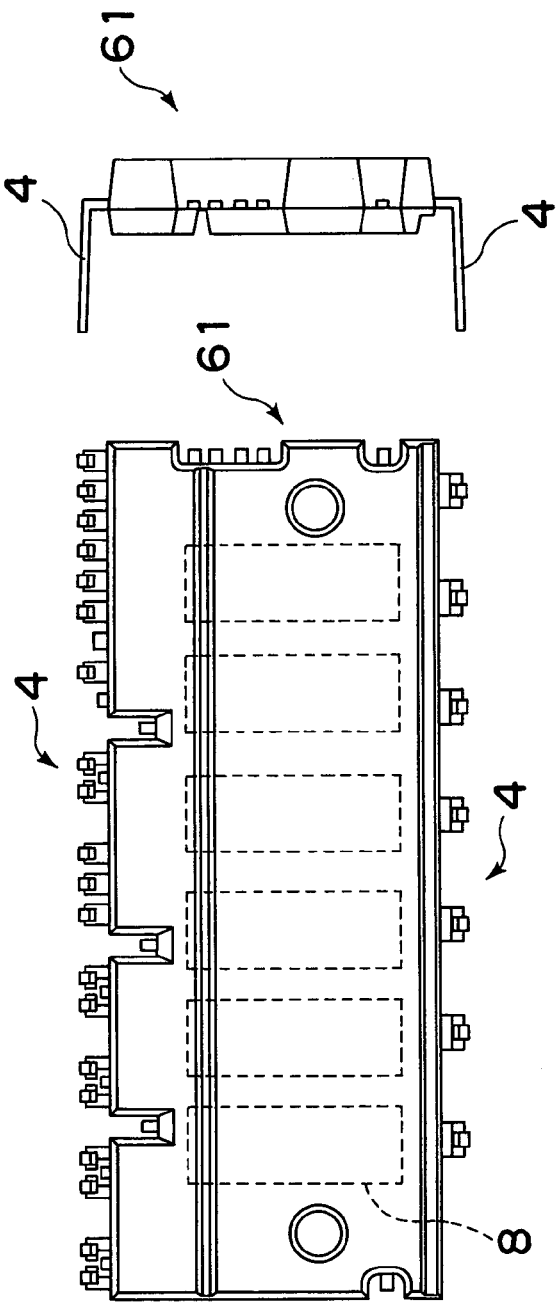

SEMICONDUCTOR DEVICE AND SEMICONDUCTOR ASSEMBLY MODULE WITH A GAP-CONTROLLING LEAD STRUCTURE

BACKGROUND OF THE INVENTION

1. Field of the Invention

The present invention relates to a semiconductor device of an insertion-mount-type and a semiconductor assembly module, more specifically relates to a semiconductor device capable of improving the solderability of leads, particularly improving the solderability of the leads for lead-free solder mounting of a power module and a semiconductor assembly module using the semiconductor device.

2. Description of the Related Art

In general, a semiconductor device of an insertion-mount-type is mounted on an external substrate by inserting leads protruding from the semiconductor device into through-holes of the external substrate. A structure of a conventional semiconductor device of an insertion-mount-type and a method for mounting the semiconductor device on an external substrate are described below by using the DIPIPM shown in FIGS. 23A–23D and FIG. 24 as an example.

As shown in FIGS. 23A–23D and FIG. 24, in the conventional semiconductor device 101, a power semiconductor element 102 and a control semiconductor element 103 are mounted on a copper lead frame 105 provided with leads 104. Both of the semiconductor elements 102 and 103 are electrically connected to their corresponding leads 104 by metallic thin wires 106 and 107. Moreover, the semiconductor device 101 is provided with a heat sink 108 for improving the heat release property. In this case, the lead frame 105 also serves as a circuit substrate. These members 102 to 108 are sealed by a plastic package 110.

As shown in FIGS. 23B and 23C, in the conventional semiconductor device 101 (DIPIPM), each of the leads 104 is constituted by a narrow front-end-side portion $B_1$ to be inserted into the through-hole of an external substrate (not illustrated) and a proximal-end-side portion $B_2$ wider than the portion $B_1$. Moreover, to mount the semiconductor device 101 on the external substrate, the semiconductor device 101 and external substrate are aligned in the height direction so that the gap (interval) between them is kept constant.

The soldering of a semiconductor device of an insertion-mount-type to an external substrate generally uses the flow soldering method or point flow soldering method. According to these methods, soldering is performed by supplying flux to the leads and external substrate which are to be soldered and then preheating them, supplying melted solder, and thereby raising the temperature of the leads and external substrate up to the liquidus-line temperature of solder or higher.

Thus, the conventional semiconductor device 101 is also soldered to the external substrate by one of the above methods. In this case, a comparatively large amount of heat is discharged to the plastic package 110 through the portion $B_2$ that is not inserted into the external substrate from the portion $B_1$ of the lead 104 that is soldered. Therefore, because the temperature of the portion $B_1$ of the lead 104 which should be soldered does not reach the liquidus-line temperature of solder under the soldering process, a problem occurs that imperfect soldering is made.

Moreover, when using Pb-free solder based on Sn whose consumption is increased in recent years from the viewpoint of environmental problems, the liquidus-line temperature rises by approx. 40° K. compared to the case of conventionally-used Sn—Pb eutectic solder. Therefore, the above problem is further actualized. This is because it is difficult to raise a process temperature such as a preheating temperature or melted-solder temperature in order to compensate the rise value (40° K.) of the liquidus-line temperature of solder.

In the case of a surface-mount-type semiconductor device, the soldering process generally uses a method of heating the whole structure to be soldered, that is, a method of heating a semiconductor device and a substrate, for example, a method such as flow soldering. Therefore, imperfect soldering due to heat dissipation from a lead to a resin package does not occur and thus, there is no problem.

For the above problem, as shown in FIG. 25, Japanese Laid-Open Patent Publication No. 76357/1988 discloses a method of making positions of height-adjusting lead-step portions 210, 211, and 212 different from each other in accordance with volumes of lead-embedding portions 204, 206, and 208 located in a resin package 201 in a semiconductor device in which a semiconductor chip 202, a metallic thin wire 203, and three types of leads 205, 207, and 209 are embedded in the resin package 201.

However, the above method has a problem that the solderability is not improved at all in the case of the lead 207 whose lead step portion 211 is closest to a substrate. To improve the solderability of a semiconductor device, it is clear that it is necessary to improve the solderability of every lead. In this point, it is insufficient to solve the problem by the above method. Particularly, in the case of solder mount using lead-free solder having a high liquidus-line temperature, there is a problem that imperfect soldering may frequency occur.

Moreover, to keep the gap between the semiconductor device and the substrate constant while contacting with the substrate, it is necessary to form two or more lead-step portions on the same-height places. However, in the case of this method, the position of the lead-step portion depends on the volume of a metallic lead in the lead-embedding portion. Therefore, to form two or more lead-step portions on same-height places, there is a problem that the design of the leads must be greatly restricted. However, when forming the lead-step portions on the same-height places between the metallic leads having volumes different from each other at the lead-embedding portion, there is a problem that preferable solderability may not be secured. Moreover, there is a problem that it is very complicated to decide the position of the lead-step portion by the above method.

Then, to avoid the above problem in accordance with an approach of raising the preheating temperature, the temperature of the whole external substrate is raised. Moreover, not only the semiconductor device 101 but also various electronic components are mounted on the external substrate and a considerable number of components having a low heat-resistant temperature (including an electrolytic capacitor) are present in the components. Therefore, the problem solution according to the approach of raising the preheating temperature is limited. Moreover, when the semiconductor device 101 or external substrate has an excessively high temperature due to preheating, flux looses an active force. Therefore, the semiconductor device 101 or external substrate cannot show its effect under the important soldering process and on the contrary, a problem occurs that the solderability is deteriorated.

Moreover, though an approach of avoiding the above problem by raising the temperature of melted solder to be supplied is made, the problem solution by the approach is limited from the viewpoint of the heat-resistant temperature of the component and deactivation of flux. Furthermore, an approach of increasing the process time is possible. In this case, however, the above problem is not solved because the temperature of the whole external substrate rises and moreover, a problem occurs that increase of the process time causes the cost of the semiconductor device to increase.

As described above, when the semiconductor device by using Pb-free solder is mounted, the liquidus-line temperature of the solder rises by 40° K. Therefore, the above problem becomes more remarkable and it is needless to say that solution by each of the above approaches becomes more difficult.

SUMMARY OF THE INVENTION

The present invention is developed to solve the above conventional problems and has an object to provide means for making it possible to easily and securely mount a semiconductor device of an insertion-mount-type on an external substrate or the like without raising the preheating temperature or the temperature of melted solder to be supplied or without increasing the process time.

A semiconductor device of an insertion-mount-type according to the present invention which has been developed to solve the above problems, includes a plastic package, a plurality of leads, one or more semiconductor elements and an electric wiring. The leads are protruding outward from the plastic package. The semiconductor elements and the electric wiring are protected by the plastic package. The electric wiring connects the semiconductor elements with the leads. The semiconductor device is to be mounted on an external electric member by inserting the leads into a lead-inserting portion of the external electric member and joining them by solder.

Each of the leads include first, second and third lead portions. The first lead portion is located at the plastic package side. The second lead portion is located at a position nearer to the tip end than the first lead portion. The third lead portion is located at a position nearer to the tip end than the second lead portion so as to be inserted into the lead-inserting portion. The sectional area of the second lead portion is set to a value smaller than that of the first lead portion. Hereupon, at least some of the leads are formed as gap-controlling leads. Each of the gap-controlling leads is provided with a gap-controlling means located at a position nearer to the tip end than the second lead portion to keep the gap between the semiconductor device and the external member constant.

The gap-controlling means may be formed by making the lead width locally larger than the width of the second lead portion. Alternatively, the gap-controlling means may be formed by forming two or more bent portions in each of the gap-controlling leads. Meanwhile, the second lead portion and the gap-controlling means are formed by forming a hole on the lead at a position nearer to the tip end than the first lead portion.

In the semiconductor device, the temperature rise property of the leads is improved due to increase of the heat resistance of the heat-release path extending from the leads to the plastic package and the solderability is improved. Moreover, because the first lead portion has a large stiffness, the easiness of fabrication of the semiconductor device is not deteriorated. Thereby, it is possible to easily and securely mount the semiconductor device on the external electric member through solder without raising the preheating temperature or the temperature of melted solder to be supplied or without increasing the process time in the soldering-mounting process.

BRIEF DESCRIPTION OF THE DRAWINGS

Various characteristics and advantages of the present invention will become clear from the following description taken in conjunction with the preferred embodiments with reference to the accompanying drawings throughout which like parts are designated by like reference numerals, in which:

FIGS. 1A–1D are a top view, a front view, a rear view and a side view of a semiconductor device of first embodiment, respectively;

FIG. 2A is a side sectional view of the semiconductor device shown in FIGS. 1A–1D while

FIG. 8A is a front view of a semiconductor device of embodiment 2 while

FIG. 11B is an enlarged perspective view of an end lead of the semiconductor device, while

FIG. 12A is an illustration showing a tie-bar cutting technique for forming an end lead of embodiment 3 by cutting a tie bar portion while

FIG. 14A is a front view of a semiconductor device of embodiment 4 while

FIGS. 17A–17C are a top view, a front view, and a side view of a semiconductor device of embodiment 5, respectively;

FIGS. 19A–19C are a top view, a front view, and a side view of a semiconductor device of embodiment 6, respectively;

DESCRIPTION OF THE PREFERRED EMBODIMENTS

Some embodiments of the present invention will be specifically described below.

Embodiment 1

The embodiment 1 of the present invention will be described below. The semiconductor device of the embodiment 1 is a package-type large DIP corresponding to static electricity.

Figure 2A:
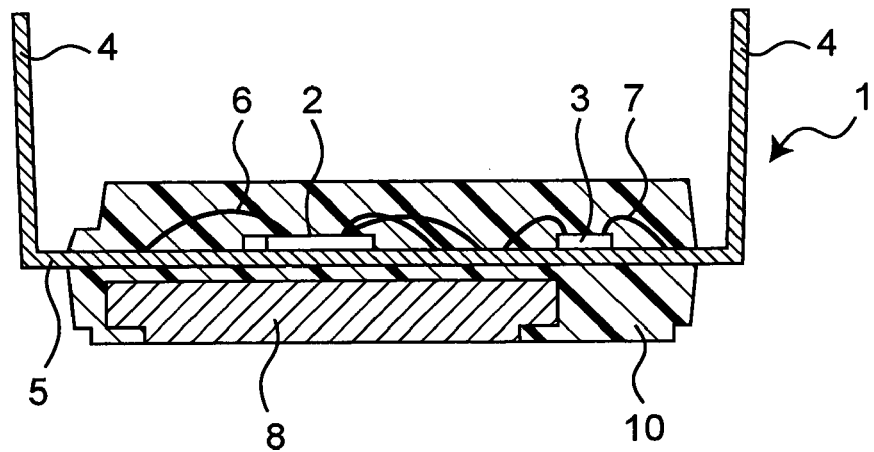
Figure 2B:
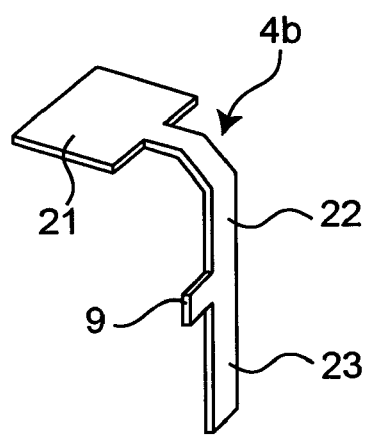
FIG. 2B is an enlarged perspective view of an end lead of the semiconductor device in FIG. 2A.
Figure 3:
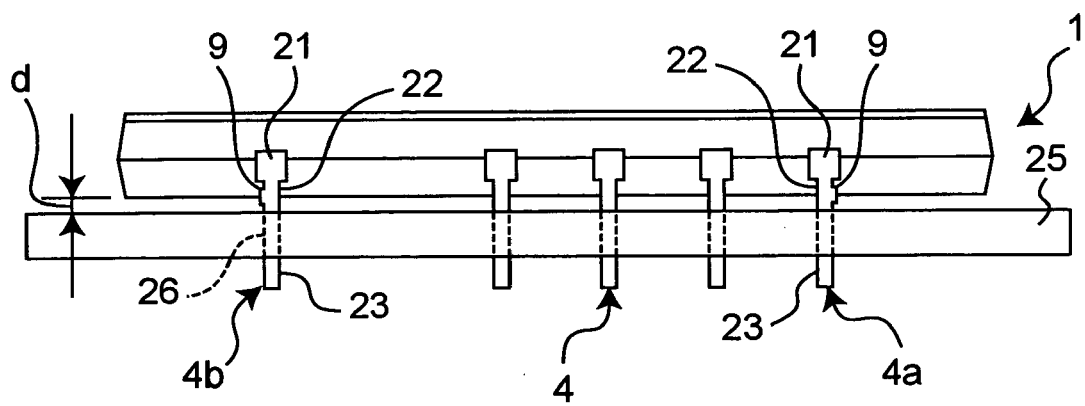
FIG. 3 is a front view showing a state in which the semiconductor device of the embodiment 1 is mounted on an external substrate.

FIGS. 1A–1D are a top view, front view, rear view and side view of the semiconductor device of the embodiment 1, respectively. FIG. 2A is a side sectional view of the semiconductor device while FIG. 2B is an enlarged perspective view of one end lead of the semiconductor device. FIG. 3 is a front view showing a state in which the semiconductor device is mounted on a substrate. The semiconductor device shown in FIGS. 1A–1D to FIG. 3 is a so-called semiconductor device of an insertion-mount-type or an insertion-mount-type semiconductor device.

As shown in FIGS. 1A–1D to FIG. 3, in the semiconductor device of the embodiment 1, a power semiconductor element 2 and a control semiconductor element 3 are mounted on a copper lead frame 5 provided with a plurality of leads 4. Both of the semiconductor elements 2 and 3 are electrically connected to each other by their respectively corresponding leads 4 and metallic thin wires 6 and 7. Moreover, the semiconductor device 1 is provided with a heat sink 8 for improving the heat release property. In this case, the lead frame 5 also serves as a circuit substrate. The semiconductor device 1 has a structure in which the above members 2 to 8 constituting the semiconductor device 1 are sealed by a plastic package 10. Some of the leads 4 are exposed to the outside of the plastic package 10.

Among the leads 4 lined up in the longitudinal direction of the semiconductor device 1 at the front or rear of the semiconductor device 1, a protruded gap-controlling portion 9 is formed on leads 4a, 4b, 4c, and 4d (hereafter respectively referred to as an "end lead") located at the both ends of the line. The gap-controlling portion 9 is provided to keep the gap d (interval) between the semiconductor device 1 and an external substrate 25 constant when inserting and mounting the semiconductor device 1 into and on the external substrate 25.

These end leads 4a to 4d are respectively provided with a first lead portion 21 protruded from a plastic package 10, a second lead portion 22 located between the first lead portion 21 and gap-controlling portion 9, and a third lead portion 23 located at a position closer to the front end (outside) than the gap-controlling portion 9 so as to be inserted into the external substrate 25. In this case, widths (dimensions in the direction vertical to lead extending direction) of the second and third lead portions 22 and 23 are respectively smaller than the width of the first lead portion 21. Sectional areas (cross section vertical to the lead extending direction) of the second and third lead portions 22 and 23 are smaller than the sectional area of the first lead portion 21. It is preferable that the length (dimension in the lead extending direction) of the gap-controlling portion 9 is smaller as long as the portion 9 has a strength capable of keeping the gap d constant.

A method for fabricating the semiconductor device 1 is described below.

In the fabrication process of the semiconductor device 1, the power semiconductor element 2 and control semiconductor element 3 are set to (mounted on) the copper lead frame 5 through die bonding. Then, the power semiconductor element 2 is electrically connected with the lead frame 5 by a metallic thin wire 6 made of Al through wire bonding while the control semiconductor element 3 is electrically connected with the lead frame 5 by a metallic thin wire 7 made of Au through wire bonding. Then, to protect the both semiconductor elements 2 and 3 and the both metallic thin wires 6 and 7, a plastic package 10 is formed by the transfer mold technique. In this case, a heat sink 8 is built in the plastic package 10.

Thereafter, an extra portion of the lead frame 5 such as a tie bar is cut off in a tie-bar-cutting step to form the leads 4 (including the end leads 4a to 4d). The leads 4 are coated with solder in accordance with the dipping technique or plating technique and moreover lead-formed. Thereby, the semiconductor device 1 (product) is completed.

The shape of the lead frame 5 is described below in detail.

Figure 4:
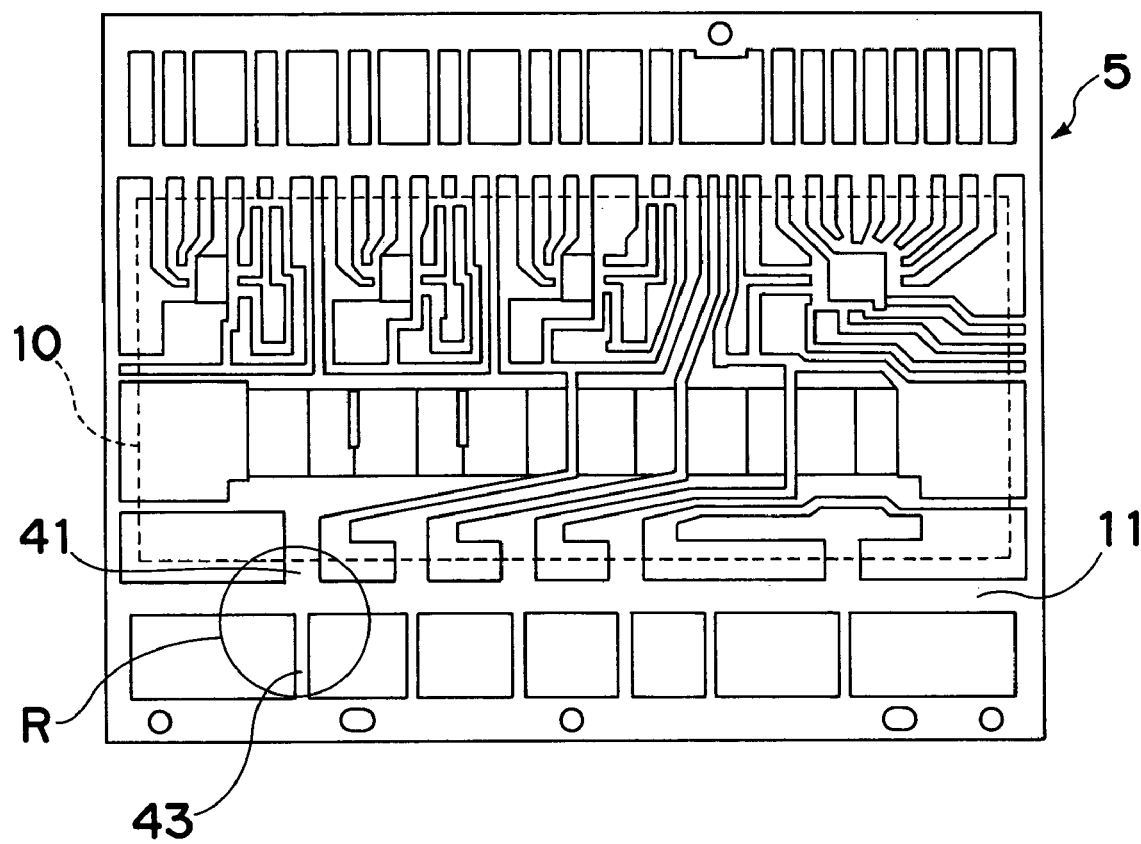
FIG. 4 is a top view of a lead frame.

FIG. 4 shows the lead frame 5. A broken line in FIG. 4 shows the outline of the plastic package 10. Moreover, FIG. 5 shows an enlarged view of the portion including a tie bar 11 (hereafter referred to as "tie bar portion") shown by R in FIG. 4.

Figure 5:
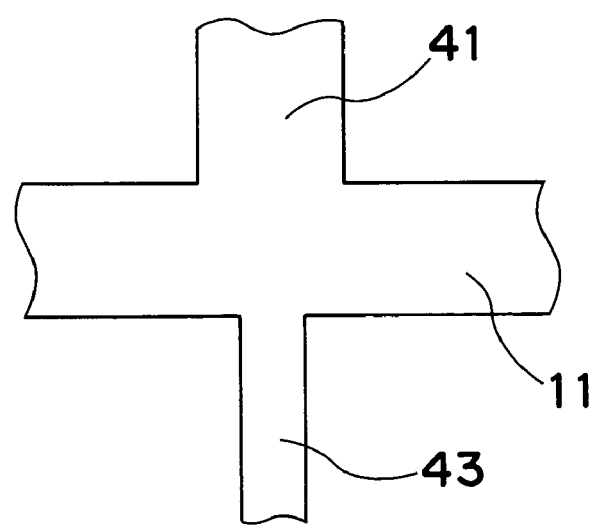
FIG. 5 is an illustration showing an enlarged tie bar portion in the lead frame shown in FIG. 4.

As shown in FIGS. 4 and 5, the width of a portion 41 (hereafter referred to as "wide portion") located at a position closer to the center of the lead frame 5 than the tie bar 11 (hereafter referred to as "inside") is larger than the width of a portion 43 (hereafter referred to as "narrow portion") located at a position closer to the end of the lead frame than the tie bar 11 (hereafter referred to as "outside"). In the state of a final product, a part of the wide portion 41 protrudes outward from the plastic package 10 to form the first lead portion 21 serving as a part of the lead 4. Thus, by increasing the width of a portion of the lead 4 close to the plastic package 10 (hereafter referred to as "proximal portion") and improving the stiffness of the portion, the stiffness of the semiconductor device 1, particularly the stiffness of the semiconductor device. 1 after mounted on the external substrate 25, is secured.

Moreover, to fabricate the semiconductor device 1, it is necessary to improve the stiffness of the proximal portion in order to prevent a trouble that the lead frame 5 is deformed, particularly a trouble that a part of the lead frame 5 is flown or twisted by a molding resin in a molding step. Thereby, easiness of fabrication of the semiconductor device 1 is secured. Because of the above reasons, it is impossible to decrease the width of the whole lead 4. Therefore, the width of the proximal portion of the lead 4, that is, the width of the first lead portion 21 is made equal to the width of a lead of this type of a conventional semiconductor device.

Then, a tie-bar-cutting step for forming the end leads 4a to 4d is described below.

Figure 6:
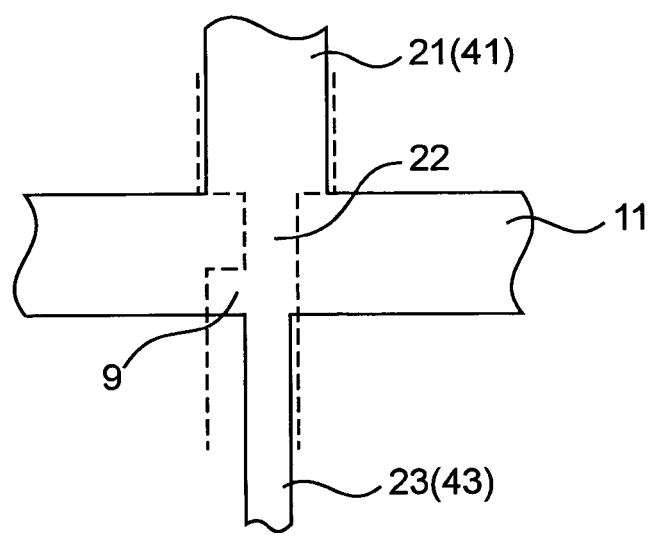
FIG. 6 is an illustration showing a tie-bar cutting technique for forming an end lead of the embodiment 1 by cutting a time bar portion.

FIG. 6 is an illustration showing a case of adding a line for cutting the tie bar shown in FIG. 5, that is, a tie-bar-cutting line (broken line) in the vicinity of the tie-bar portion. That is, in the tie-bar-cutting step, the vicinity of the tie-bar portion is cut along the tie-bar-cutting line. As shown in FIG. 6, by cutting the vicinity of the tie-bar portion including the tie bar 11, wide portion 41, and narrow portion 43 along the tie-bar-cutting line, it is possible to form the end leads 4a to 4d provided with the gap-controlling portion 9 and first to third lead portions 21 to 23. Therefore, it is possible to easily obtain a lead shape that is a feature of the present invention while securing a fabrication property almost the same as that of the fabrication process of this type of conventional semiconductor device.

Figure 7:
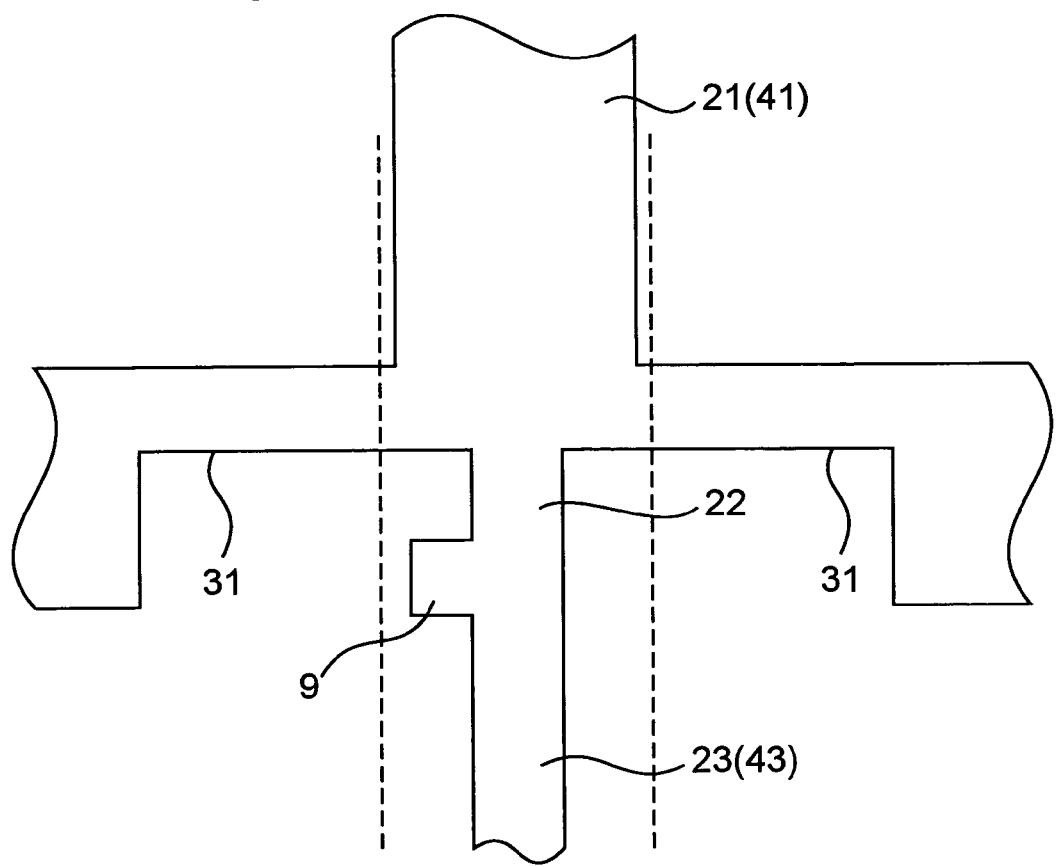
FIG. 7 is an illustration showing another tie-bar cutting technique for forming an end lead of the embodiment 1 by cutting a tie bar portion.

FIG. 7 shows another technique for forming the end leads 4a to 4d. As shown in FIG. 7, the forming method uses the lead frame 5 in which two cutouts 31 respectively having a predetermined shape are formed on the tie bar 11. These cutouts 31 are formed on the outside portion of the tie bar 11 at the both sides of the narrow portion 43. Moreover, these cutouts 31 respectively have a shape in which the gap-controlling portion 9 and second lead portion 22 are previously formed on the tie bar 11.

According to the above forming technique, it is possible to obtain a lead shape which is a feature of the present invention only by linearly cutting a tie bar along the outline of the wide portion 41 located at a position further inside than the tie bar 11 in a tie-bar-cutting step as shown by a broken line in FIG. 7. In this case, it is possible to easily perform press cutting a simple die, this is also advantageous from the viewpoint of cost. Moreover, because the gap-controlling portion 9 is formed on the lead frame 5, there is also an advantage that the shape of the gap-controlling portion 9 is stabilized.

Particularly, when the semiconductor device 1 includes a power semiconductor element, the sectional area of the third lead portion 23 is frequently decided in accordance with a current capacity. In this case, it is impossible to make the sectional area of the second lead portion 22 smaller than that of the third lead portion 23. Therefore, by equalizing the sectional area of the second lead portion 22 with that of the third lead portion 23, it is possible to most efficiently improve the solderability. That is, by equalizing the sectional area (width) of the second lead portion 22 with that (width) of the third lead portion 23 and moreover forming the gap-controlling portion 9 between the portions 22 and 23, an advantage can be obtained that it is possible to maximally improve the solderability in addition to the above advantage.

A method for mounting the semiconductor device 1 on the external substrate 25 is described below by referring to FIG. 3. To mount the insertion-mount-type semiconductor device 1, the leads 4 (including end leads 4a to 4d) are inserted into their respectively corresponding through-holes 26 formed on the external substrate 25. In this case, the semiconductor device 1 is positioned so that the gap d (interval) between the semiconductor device 1 and the external substrate 25 becomes constant.

Then, flux is supplied to the through-holes 26 and the leads 4 of the external substrate 25 to be soldered. Thereafter, melted solder is supplied to the through-holes 26 and leads 4 from the face of the external substrate 25 opposite to the face of it on which the semiconductor device 1 is mounted. Then, by raising the temperature of the through-holes 26 and that of the leads 4 to the liquidus-line temperature of the supplied solder or higher, preferable soldering is performed and thereafter the solder is solidified.

In this case, when the above temperature rise is insufficient, solder wetting becomes insufficient to cause imperfect soldering. As described above, this is a phenomenon generally caused because the quantity of heat to be released from the leads 4 to the package 10 is large. Therefore, in the case of the semiconductor device 1 of this embodiment 1, the quantity of heat to be released from the leads 4 to the package 10 is reduced by setting the second lead portion 22 having a small sectional area (width). That is, because the sectional area of the second lead portion 22 is small, the quantity of heat to be released from the leads 4 to the package 10 is greatly reduced and therefore, the above phenomenon does not occur. Thereby, it is possible to realize preferable solderability. More specifically, by decreasing the sectional area of the second lead portion 22 serving a heat transfer route from the leads 4 to the package 10, the heat resistance from the leads 4 to the package 10 is increased so as to reduce the quantity of heat to be released from the leads 4 to the package 10.

As the result, according to the semiconductor device 1 of the embodiment 1, it is possible to reduce the frequency of imperfect soldering without changing conventional soldering processes. Therefore, an advantage is obtained that it is possible to reduce the cost of repair of defective products.

Thus, in the case of the semiconductor device 1 of the embodiment 1, the first lead portion 21 having a large sectional area located at the proximal portion, gap-controlling portion 9, and second lead portion 22 are formed on the end leads 4a to 4d protruding from the plastic package 10 respectively. Moreover, the sectional area of the second lead portion 22 is smaller than that of the first lead portion 21 and smaller than the width of the gap-controlling portion 9. Therefore, it is possible to improve the solderability when inserting the leads 4 into the external substrate 25, soldering the leads 4, and mounting the semiconductor device 1 while securing the stiffness of the semiconductor device 1 after mounted on the external substrate 25, easiness of fabrication of the semiconductor device 1, and alignment property of the semiconductor device 1 when mounted on the external substrate 25.

Embodiment 2

The embodiment 2 of the present invention will be described below by referring to FIGS. 8A and 8B to FIG. 10. The semiconductor device of the embodiment 2 has many points common to those of the embodiment 1 shown in FIGS. 1A–1D to FIG. 7. Therefore, to avoid duplication of description, points of the embodiment 2 different from those of the embodiment 1 are mainly described below. In FIGS. 8A and 8B to FIG. 10, a member common to that of the embodiment 1 shown in FIGS. 1A–1D to FIG. 7 is provided with the same reference number. Though a case is described below in which the shape of the gap-controlling portion 9 is rectangular, the shape is not restricted to a rectangle. A square, trapezoidal, or triangular shape is allowed as long as the shape can control a gap.

Figure 8A:
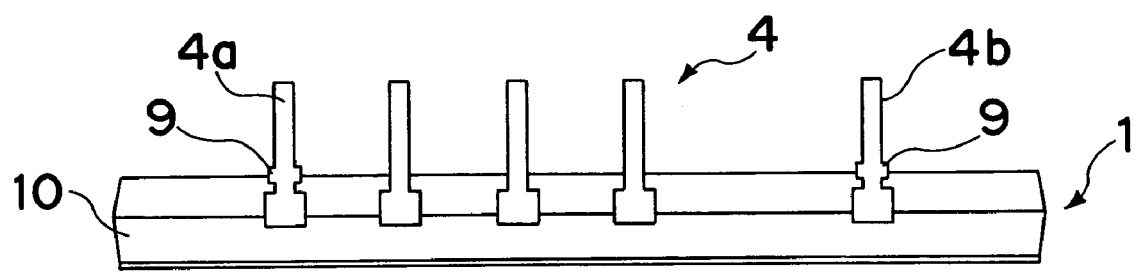
Figure 8B:
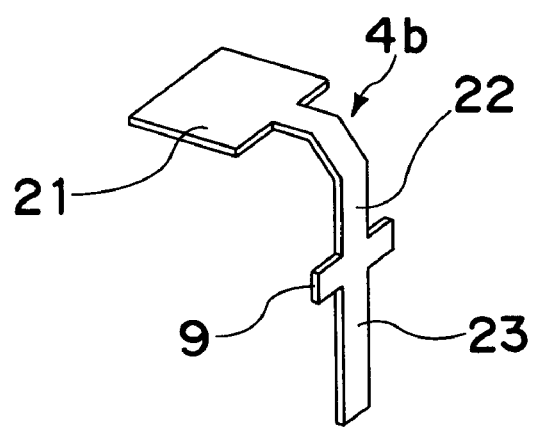
FIG. 8B is an enlarged perspective view showing an end lead of the semiconductor device.

FIG. 8A is a front view of a semiconductor device of the embodiment 2. FIG. 8B is an enlarged perspective view of an end lead of the semiconductor device. The semiconductor device shown in FIGS. 8A and 8B is an insertion-mount-type semiconductor device.

As shown in FIGS. 8A and 8B, in the case of the semiconductor device 1 of the embodiment 2, a gap-controlling portion 9 formed on each of end leads 4a to 4b protrudes in the both directions in the lead width direction. That is, a second lead portion 22, the gap-controlling section 9, and a third lead portion 23 form a cross. Other points are the same as those of the semiconductor device 1 of the embodiment 1. That is, the semiconductor device 1 of the embodiment 2 is different from the semiconductor device of the embodiment 1 only in shapes of the end leads 4a to 4d.

Then, the tie-bar cutting step for forming the end leads 4a to 4d will be described below.

Figure 9:
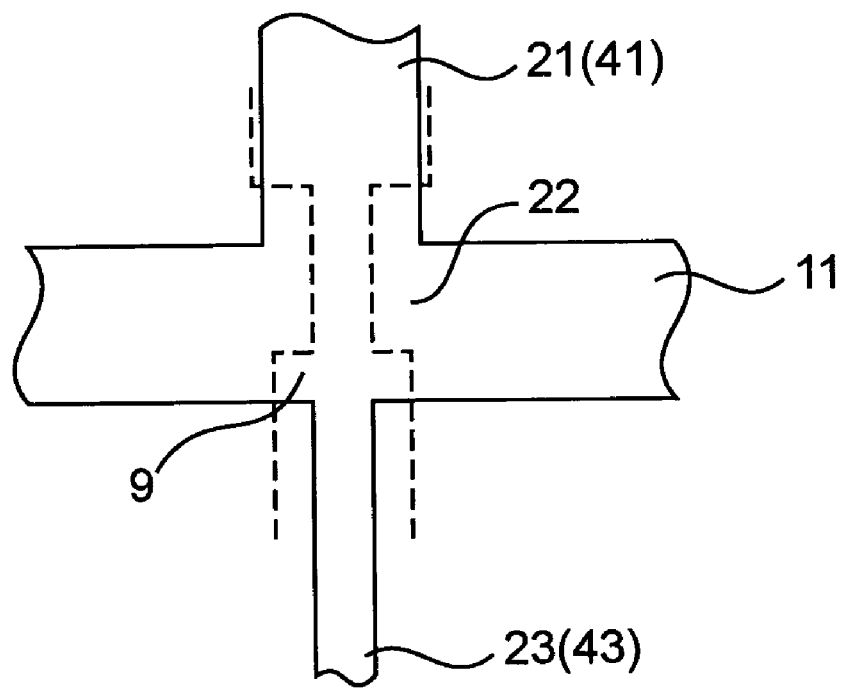
FIG. 9 is an illustration showing a tie-bar cutting technique for forming an end lead of the embodiment 2 by cutting a tie bar portion.

FIG. 9 is a tie bar obtained by adding a tie-bar cutting line (broken line) to the vicinity of the tie-bar portion shown in FIG. 5. That is, in the tie-bar cutting step, the vicinity of the tie-bar portion is cut along the tie-bar cutting line. As shown in FIG. 9, by cutting the vicinity of the tie-bar portion including a tie bar 11, a wide portion 41, and a narrow portion 43 along the tie-bar cutting line, it is possible to form the end leads 4a to 4d provided with the gap-controlling portion 9 and first to third lead portions 21 to 23 shown in FIG. 8B. Therefore, it is possible to easily obtain a lead shape which is a feature of the present invention while almost securing the fabrication property same as that of the fabrication process of this type of conventional semiconductor device.

Figure 10:
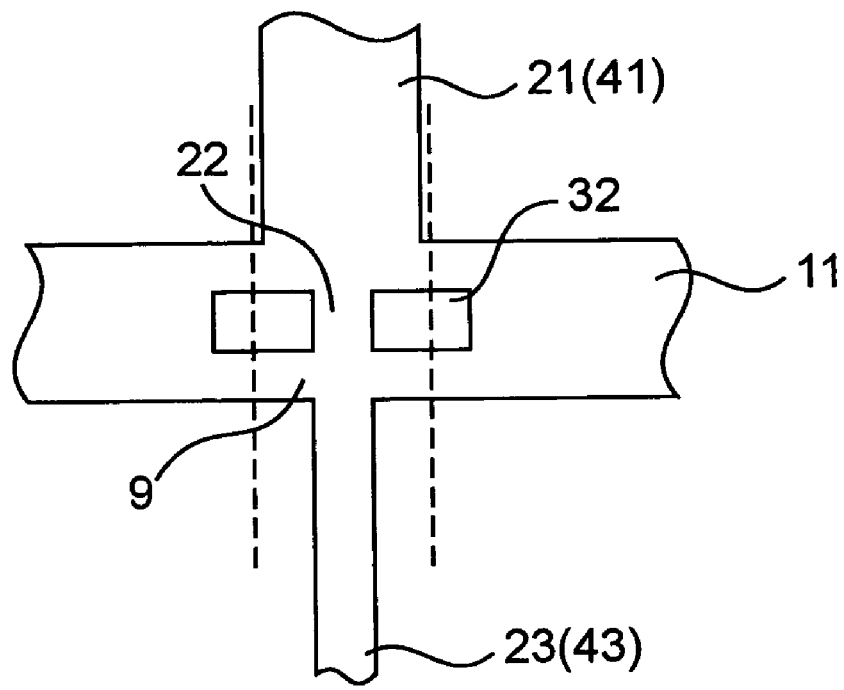
FIG. 10 is an illustration showing another tie-bar cutting technique for forming an end lead of the embodiment 2 by cutting a tie bar portion.

FIG. 10 shows another technique for forming the end leads 4a to 4d. As shown in FIG. 10, this forming method uses a lead frame 5 in which two rectangular holes 32 are formed on the tie bar 11. These rectangular holes 32 are formed at almost the central portion of the tie bar 11 at both sides of the narrow portion 43. Moreover, these rectangular holes 32 respectively have a shape in which the gap-controlling portion 9 and the second lead portion 22 are formed on the tie bar 11 by linearly cutting the tie bar.

According to the above forming technique, only by linearly performing tie-bar cutting as shown by a broken line in FIG. 10 along the outline of the wide portion 41 located inside of the tie bar 11 in the tie-bar cutting step, it is possible to easily obtain a lead shape which is a feature of the present invention. In this case, because it is possible to easily perform press cutting by a simple die, this is advantageous also from the viewpoint of cost.

According to the above forming technique, the following advantages are further added compared to the case of the embodiment 1. That is, because the gap-controlling portion 9 protrudes to the both sides, the positioning stability is high. Moreover, because the rectangular holes 32 are formed on the tie bar 11 instead of the cutouts 31, the tie bar portion has a large stiffness compared to the case in which the cutouts 31 (refer to FIG. 7) are formed and the influence of the rectangular holes 32 on the fabrication process of the semiconductor device 1 is very small. In this case, it is allowed to bend the end leads 4a to 4d at either of the first lead portion 21 and second lead portion 22. In the case of this forming technique, it is impossible to previously completely form (build) the gap-controlling portion 9 in the lead frame 5.

Also in the case of the semiconductor device 1 of the embodiment 2, it is possible to improve the solderability similarly to or more than the case of the semiconductor device 1 of the embodiment 1 when inserting the leads 4 into the external substrate 25, soldering the leads 4, and mounting the semiconductor device 1 on the external substrate 25 while securing the stiffness of the semiconductor device 1 after mounted on the external substrate 25, fabrication easiness of the semiconductor device 1, and alignment property when mounting the semiconductor device 1 on the external substrate 25.

Embodiment 3

The embodiment 3 of the present invention will be described below by referring to FIGS. 11A–11C to FIG. 13. A semiconductor device of the embodiment 3 has many points common to the semiconductor device of the embodiment 1 shown in FIGS. 1A–1D to FIG. 7. Therefore, to avoid duplication of description, points different from those of the embodiment 1 are mainly described below. In FIGS. 11A–11C to FIG. 13, a member common to that of the embodiment 1 shown in FIGS. 1A–1D to FIG. 7 is provided with the same reference number.

Figure 11A:
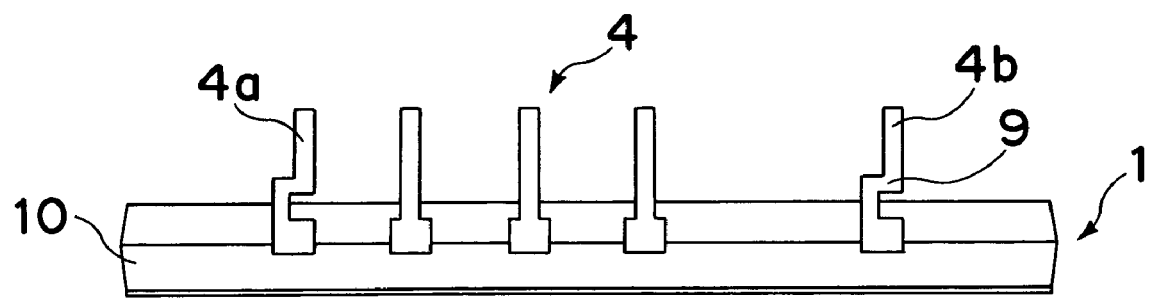
FIG. 11A is a front view of a semiconductor device of third embodiment.
Figure 11B:
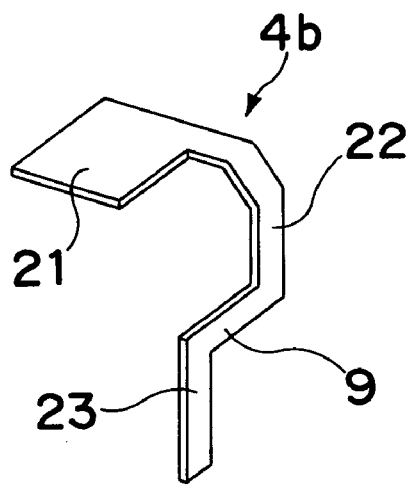
Figure 11C:
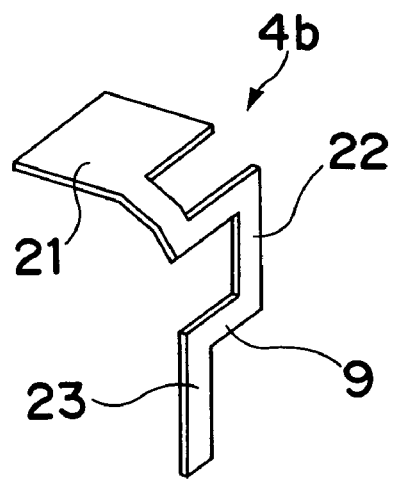
FIG. 11C is a perspective view showing a modification of an end lead.

FIG. 11A is a front view of a semiconductor device of the embodiment 3. FIG. 11B is an enlarged perspective view showing one end lead of the semiconductor device. FIG. 11C is a perspective view showing a modification of an end lead. The semiconductor device shown in FIGS. 11A–11C is an insertion-mount-type semiconductor device.

As shown in FIGS. 11A–11C, in the case of the semiconductor device 1 of the embodiment 3, a gap-controlling portion 9 formed on each of end leads 4a to 4d is formed by forming a plurality of bent portions on a narrow portion of each of the end leads 4a to 4d, that is, bending the narrow portion a plurality of times. Two right-angle bent portions are formed on the end lead 4b shown in FIGS. 11A and 11B and four right-angle bent portions are formed on the end lead 4d shown in FIG. 11C. Other points are the same as those of the semiconductor device 1 of the embodiment 1. That is, the semiconductor device 1 of the embodiment 3 is different from that of the embodiment 1 only in shapes of the end leads 4a to 4d.

Then, a tie-bar cutting step for forming the end leads 4a to 4d is described below.

Figure 12A:
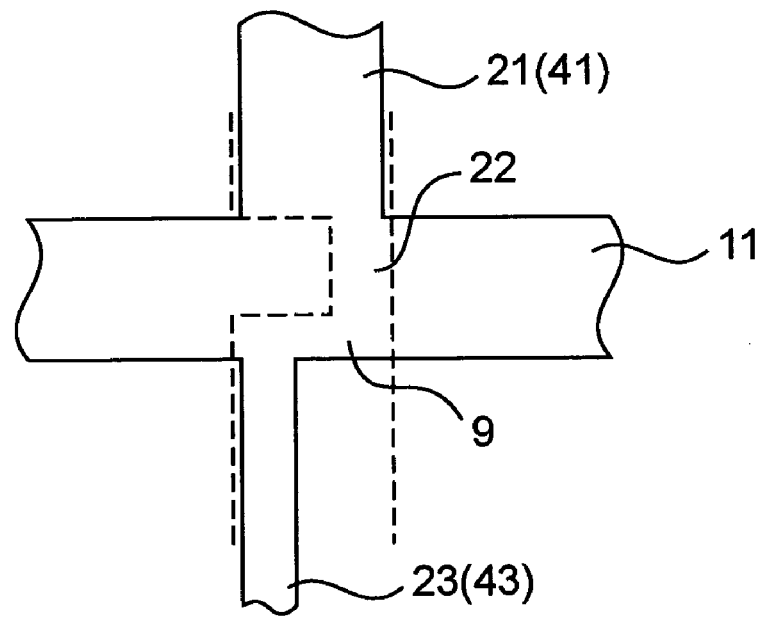

In the tie-bar cutting step of the embodiment 3, the vicinity of the tie-bar portion is cut along the tie-bar cutting line (broken line) shown in FIG. 12A. In the case of this vicinity of the tie-bar portion, the position of the narrow portion 43 is shifted in the direction for the tie bar 11 to extend compared to the case of the vicinity of the tie-bar portion shown in FIG. 5.

Figure 12B:
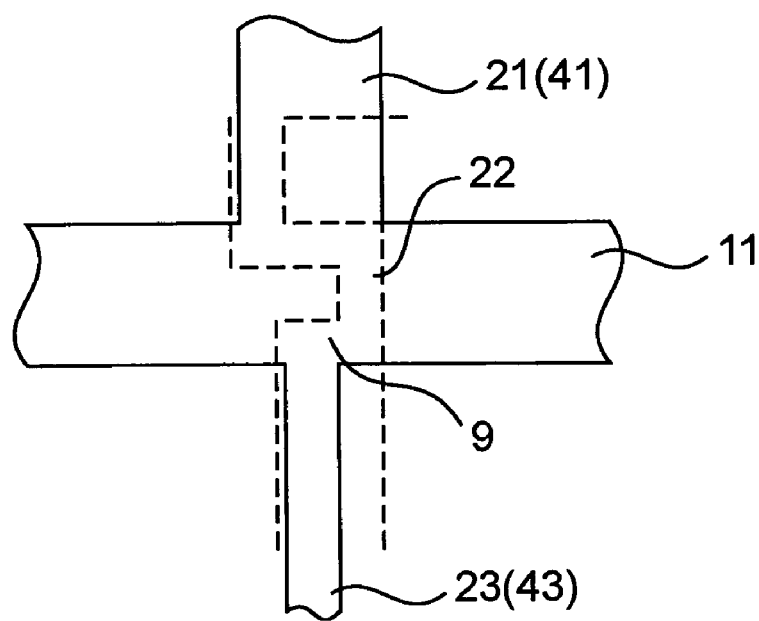
FIG. 12B is an illustration showing a tie-bar cutting technique for forming a modification of the end lead shown in FIG. 11C.

As shown in FIG. 12A, by cutting the vicinity of the tie-bar portion including the tie bar 11, wide portion 41, and narrow portion 43 along the tie-bar cutting line, it is possible to form the end leads 4a to 4d respectively provided with the gap-controlling portion 9 and first to third lead portions 21 to 23 shown in FIG. 11B. To form the end leads 4a to 4d shown in FIG. 11C, the vicinity of the tie-bar portion shown in FIG. 5 is cut along the tie-bar cutting line (broken line) shown in FIG. 12B. Therefore, it is possible to easily obtain a lead shape which is a feature of the present invention while almost securing the fabrication property same as that of the fabrication process of this type of conventional semiconductor device.

Figure 13:
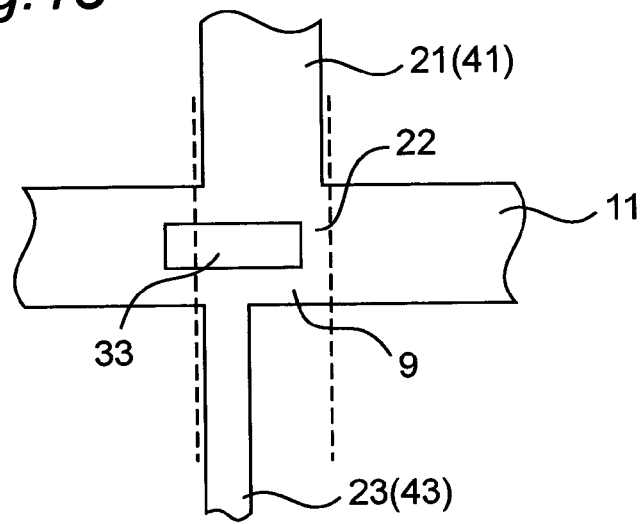
FIG. 13 is an illustration showing another tie-bar cutting technique for forming an end lead of the embodiment 3 by cutting a tie bar portion.

FIG. 13 shows another technique for forming the end leads 4a to 4d. As shown in FIG. 13, this forming technique uses a lead frame 5 in which a rectangular hole 33 is formed on the tie bar 11. The rectangular hole 33 is formed at almost the center of the tie bar 11 at a position slightly shifted in the direction for the tie bar 11 to extend from the portion corresponding to the wide portion 41. Moreover, the rectangular hole 33 has a shape in which the gap-controlling portion 9 and second lead portion 22 are formed on the tie bar 11 through linear tie-bar cutting.

According to the above forming technique, it is possible to easily obtain a lead shape which is a feature of the present invention only by linearly cutting the tie bar 11 as shown by the broken line in FIG. 13 along the outline of the wide portion 41 located inside of the tie bar 11 in the tie-bar cutting step. In this case, because it is possible to easily perform press cutting by a simple die, this is advantageous for cost.

According to this forming technique, the following advantage is further added compared to the case of the embodiment 2. That is, it is possible to substantially lengthen the second lead portion 22. Moreover, as shown in FIG. 11C, by forming a shape having more than three bent portions, it is possible not only to lengthen the second lead portion 22 but also to lengthen the service life of a soldered portion in accordance with the stress relief effect.

Thus, also in the case of the semiconductor device 1 of the embodiment 3, it is possible to improve the solderability when inserting the leads 4 into the external substrate 25, soldering the leads 4, and mounting the semiconductor device 1 while securing the stiffness of the semiconductor device 1 after mounted on the external substrate 25, easiness of fabrication of the semiconductor device 1, and alignment property when mounting the semiconductor device 1 on the external substrate 25.

Embodiment 4

The embodiment 4 of the present invention will be described below by referring to FIGS. 14A and 14B to FIG. 16. A semiconductor device of the embodiment 4 has many points common to those of the semiconductor device of the embodiment 1 shown in FIGS. 1A–1D to FIG. 7. Therefore, to avoid duplication of description, points different from those of the embodiment 1 are mainly described below. In FIGS. 14A and 14B to FIG. 16, a member common to that of the embodiment 1 shown in FIGS. 1A–1D to FIG. 7 is provided with the same reference number.

Figure 14A:
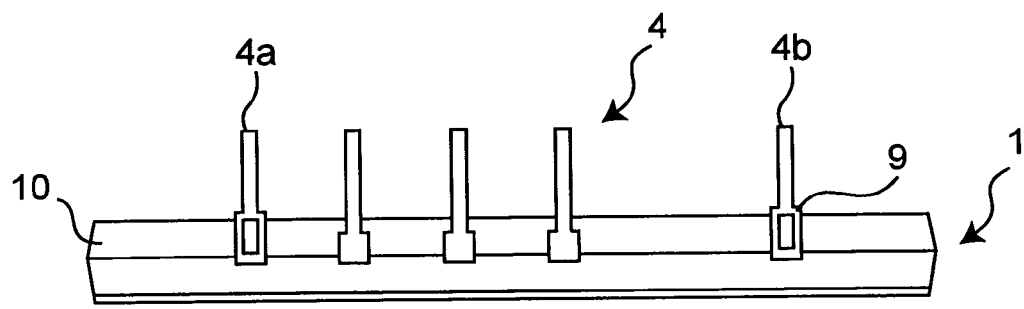
Figure 14B:
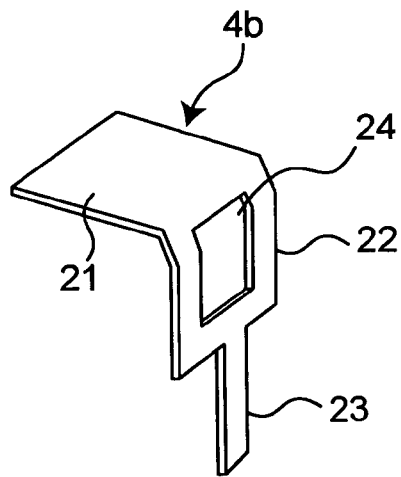
FIG. 14B is an enlarged perspective view of an end lead of the semiconductor device.

FIG. 14A is a front view of the semiconductor device of the embodiment 4. FIG. 14B is an enlarged perspective view of one end lead of the semiconductor device. The semiconductor device shown in FIGS. 14A and 14B is an insertion-mount-type semiconductor device. As shown in FIGS. 14A and 14B, in the case of the semiconductor device 1 of the embodiment 4, a gap-controlling portion 9 formed on each of end leads 4a to 4d and a second lead portion 22 having a small sectional area are adjacent to a first lead portion 21 and a rectangular hole portion 24 is formed on a portion having the same width as the first lead portion 21. Other points are the same as those of the semiconductor device 1 of the embodiment 1. That is, the semiconductor device 1 of the embodiment 4 is different from the semiconductor device of the embodiment 1 only in shapes of the end leads 4a to 4d.

Figure 15:
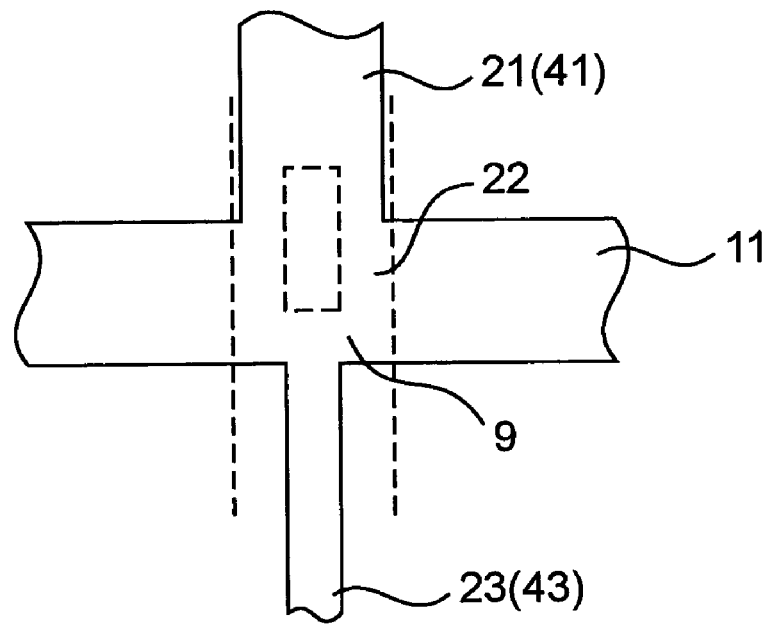
FIG. 15 is an illustration showing a tie-bar cutting technique for forming an end lead of the embodiment 4 by cutting a tie bar portion.

Then, the tie-bar cutting step for forming the end leads 4a to 4d is described below. In the tie-bar cutting step of the embodiment 4, the vicinity of the tie-bar portion shown in FIG. 5 is cut along the tie-bar cutting line (broken line) shown in FIG. 15. As shown in FIG. 15, by cutting the vicinity of the tie-bar portion including the tie bar 11, wide potion 41, and narrow portion 43 along the time-bar cutting line, it is possible to form the end leads 4a to 4d provided with the gate-controlling portion 9 and first to third lead portions 21 to 23 shown in FIG. 14B. Therefore, it is possible to easily obtain a lead shape which is a feature of the present invention while almost securing the fabrication property same as that of the fabrication process of this type of conventional semiconductor device.

Figure 16:
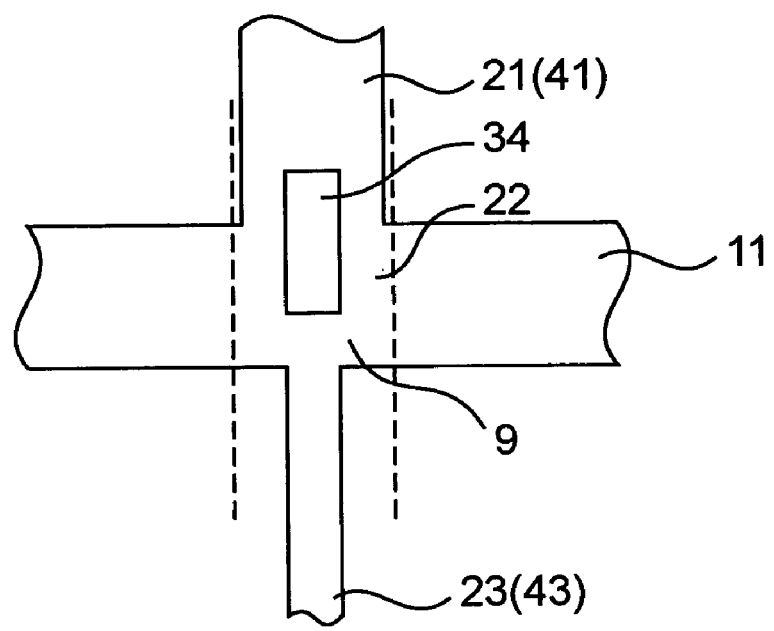
FIG. 16 is an illustration showing another tie-bar cutting technique for forming an end lead of the embodiment 4 by cutting a tie bar portion.
Figure 18A:
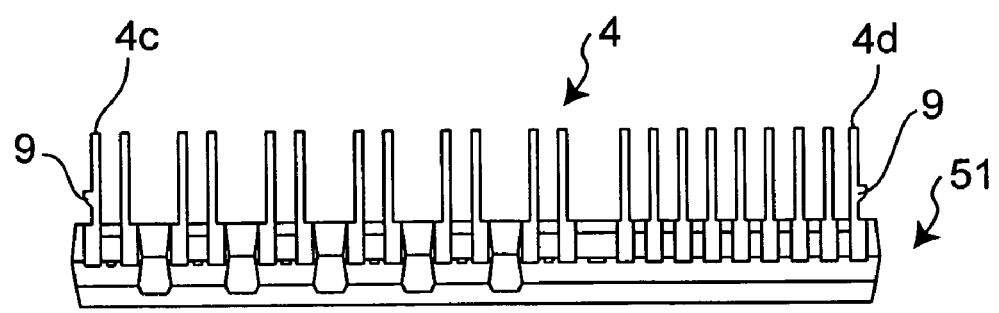
FIGS. 18A and 18B are a rear view and side sectional view of a semiconductor device of embodiment 5, respectively.
Figure 18B:
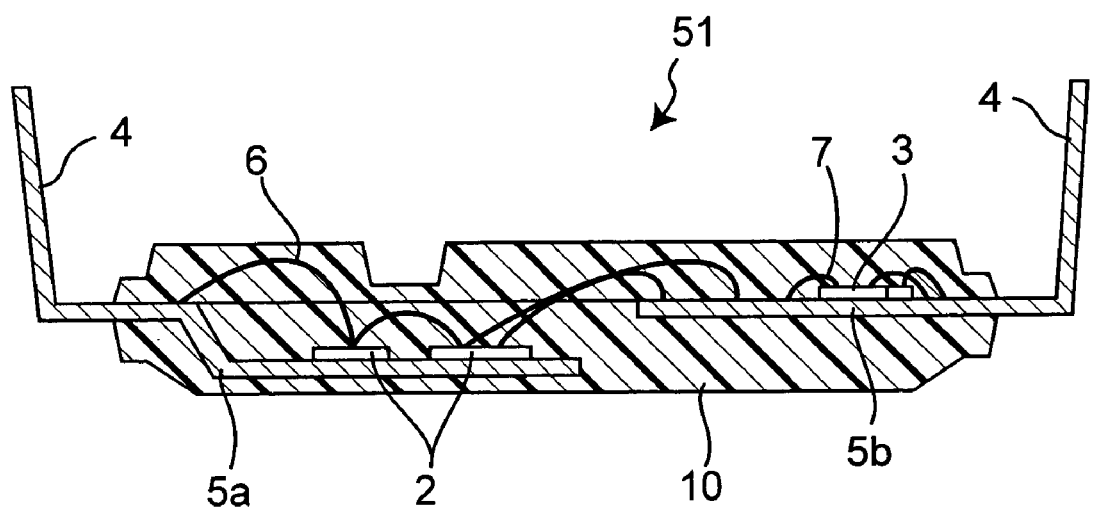
Figure 20A:
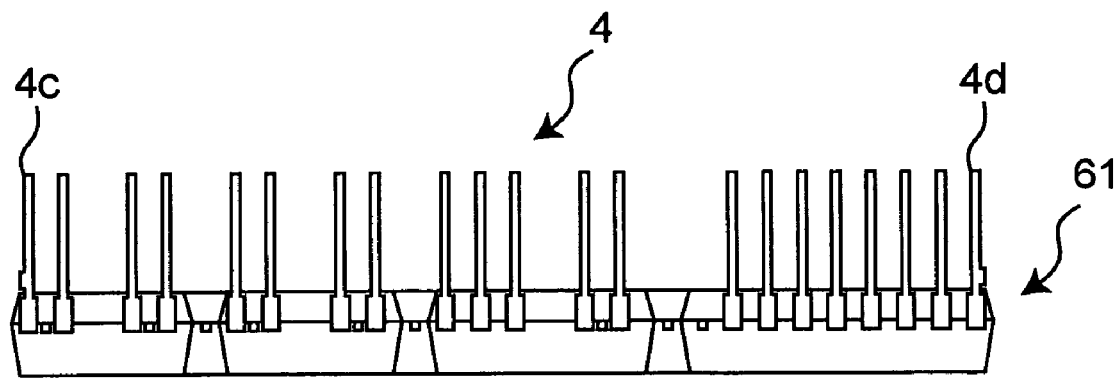
FIGS. 20A and 20B are a rear view and a side sectional view of he semiconductor device of the embodiment 6, respectively.
Figure 20B:
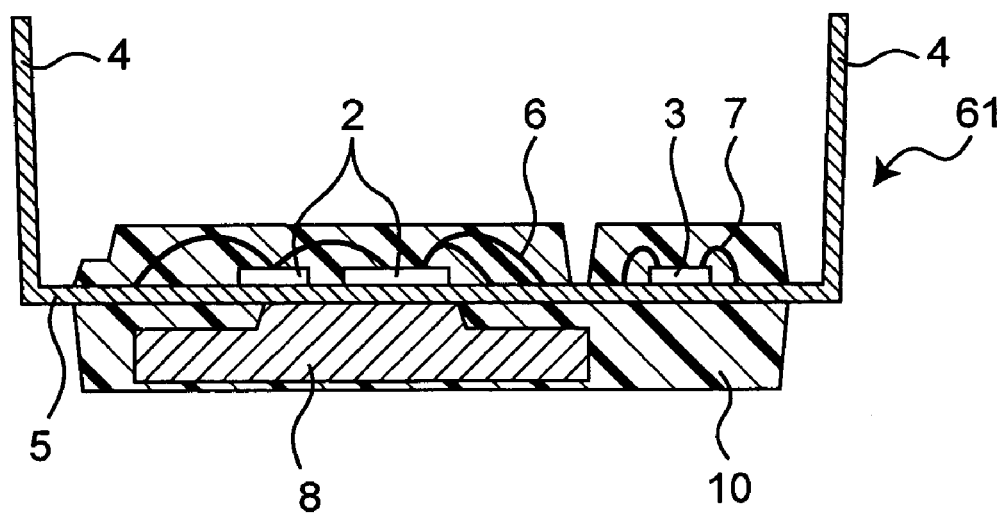

FIG. 16 shows another technique for forming the end leads 4a to 4d. As shown in FIG. 16, the forming technique uses the lead frame 5 provided with a rectangular hole 34 for the tie bar 11. The rectangular hole 34 is formed by extending to the tie bar 11 and wide portion 41. Moreover, the rectangular hole 34 has a shape in which the gap-controlling portion 9 and second lead portion 22 are formed on the tie bar 11 and wide portion 41 through linear tie-bar cutting.

According to the above technique, it is possible to easily obtain a lead shape which is a feature of the present invention only by linearly performing tie-bar cutting as shown by a broken line in FIG. 16 along the outline of the wide portion 41 located inside of the tie bar 11. In this case, because it is possible to easily perform press cutting by a simple die, this is also advantageous for cost.

According to the above technique, the following advantage is further added compared to the case of the embodiment 3. That is, it is possible to lengthen the second lead portion 22. Moreover, it is possible to improve the stiffness of the second lead portion 22. The semiconductor device 1 of the embodiment 4 also has the same advantage as the semiconductor device 1 of the embodiment 2 in addition to the above.

Thus, also in the case of the semiconductor device 1 of the embodiment 4, it is possible to improve the solderability when inserting the leads 4 into the external substrate 25, soldering the leads 4, and mounting the semiconductor device 1 while securing the stiffness of the semiconductor device 1 after mounted on the external substrate 25, easiness of fabrication of the semiconductor device 1, and alignment property when mounting the semiconductor device 1 on the external substrate 25.

Embodiment 5

The embodiment 5 of the present invention will be described below by referring to FIGS. 17A–17C and FIGS. 18A and 18B. The semiconductor device of the embodiment 5 has many points common to those of the semiconductor device of the embodiment 1 shown in FIGS. 1A–1D to FIG. 7. Therefore, to avoid duplication of description, points different from those of the embodiment 1 are mainly described. In FIGS. 17A–17C and FIGS. 18A and 18B, a member common to that of the embodiment 1 shown in FIGS. 1A–1D to FIG. 7 is provided with the same reference number.

As shown in FIGS. 17A–17C and FIGS. 18A and 18B, a semiconductor device 51 of this embodiment 5 is different from the semiconductor device 1 of the embodiment 1 in configuration. That is, the semiconductor device 51 of the embodiment 5 is different from the semiconductor device 1 of the embodiment 1 in that no heat sink is used and a lead frame 5 is bent. However, other configurations of the semiconductor device 51 of the embodiment 5 are the same as those of the semiconductor device 1 of the embodiment 1.

In the case of the semiconductor device 51, a power semiconductor element 2 is mounted on a portion 5a where the lead frame 5 is bent and control semiconductor elements 3 are mounted on a portion 5b where the lead frame 5 is not bent. Moreover, a metallic thin wire 6 made of Al (Al thin wire) is used for connection between the power semiconductor elements 2 and connection between the power semiconductor elements 2 and the lead frame 5 and a metallic thin wire 7 made of Au (Au thin wire) is used for connection between the control semiconductor elements 3 and the lead frame 5. The above members 2 to 7 are entirely sealed by a plastic package 10 formed by the transfer molding technique. However, for the lead 4, only part of the proximal portion is sealed.

The end leads 4a to 4d of the semiconductor device 51 are formed into shapes same as those of the end leads 4a to 4d of the semiconductor device 1 of the embodiment 1 and formed in a tie-bar cutting step same as the case of the embodiment 1. However, it is also allowed that the end leads 4a to 4d of the semiconductor device 51 are formed into shapes same as those of the end leads 4a to 4d of the semiconductor device 1 of any one of the embodiments 2 to 4 and formed in a tie-bar cutting step same as the case of any one of the embodiments 2 to 4. In the case of the semiconductor device 51, functions and advantages same as those of the semiconductor device 1 of the embodiment 1 are obtained. When forming the end leads 4a to 4d into the same shapes as the case of the embodiment 2 to 4 and using a tie-bar cutting step same as the case of the embodiments 2 to 4, it is a matter of course that functions and advantages same as the case of the semiconductor devices 1 of the embodiments 2 to 4 are obtained.

As described above, also in the case of the semiconductor device 51 of the embodiment 5, it is possible to improve the solderability when inserting the leads 4 into the external substrate 25, soldering the leads 4, and mounting the semiconductor device 1 while securing the stiffness of the semiconductor device 1 after mounted on the external substrate 25, easiness of fabrication of the semiconductor device 1, and alignment property when mounting the semiconductor device 1 on the external substrate 25.

Embodiment 6

The embodiment 6 of the present invention will be described below by referring to FIGS. 19A–19C and FIGS. 20A and 20B. A semiconductor device of the embodiment 6 has many points common to those of the embodiment 1 shown in FIGS. 1A–1D to FIG. 7. Therefore, to avoid duplication of description, point different from the case of the embodiment 1 are mainly described below. In FIGS. 19A–19C and FIGS. 20A and 20B, a member common to that of the embodiment 1 is provided with the same reference number.

As shown in FIGS. 19A–19C and FIGS. 20A and 20B, a semiconductor device 61 of this embodiment 6 is different from the semiconductor device 1 of the embodiment 1 in configuration. That is, the semiconductor device 61 of the embodiment 6 is different from the semiconductor device 1 of the embodiment 1 in that heat sink 8 is joined to a lead frame 5, divided to be plural heat sinks 8, and constituted as a full molding structure in which the heat sinks 8 are completely included in a plastic package 10. However, other configurations of the semiconductor device 61 of the embodiment 6 are the same as those of the semiconductor device 1 of the embodiment 1.

In the case of the semiconductor device 61, a power semiconductor device 2 and control semiconductor device 3 are mounted on the lead frame 5. Moreover, a metallic thin wire 6 made of Al is used for connection between the power semiconductor devices 2 and connection between the power semiconductor devices 2 and the lead frame 5 and a metallic thin wire 7 made of Au is used for connection between the control semiconductor devices and the lead frame 5. Moreover, the heat sinks 8 are joined to the lead frame 5 at positions opposite to the power semiconductor devices 2. The above members 2 to 8 are entirely sealed by the plastic package 10 formed by the transfer molding technique. However, for the lead 4, only part of the proximal portion is sealed.

End leads 4a to 4d of the semiconductor device 61 are formed into the same shapes as the end leads 4a to 4d of the semiconductor device 1 of the embodiment 1 and formed in a tie-bar cutting step same as the case of the embodiment 1. However, it is also allowed that the end leads 4a to 4d of the semiconductor device 61 are formed into the same shapes as the end leads 4a to 4d of the semiconductor device 1 of any one of the embodiments 2 to 4 in a time-bar cutting step same as the case of any one of the embodiments 2 to 4. In the case of the semiconductor device 61, functions and advantages are obtained same as those of the semiconductor device 1 of the embodiment 1. When forming the end leads 4a to 4d into the case of any one of the embodiments 2 to 4 and using a tie-bar cutting step same as the case of any one of the embodiments 2 to 4, it is a matter of course that functions and advantages same as those of any one of the embodiments 2 to 4 are obtained.

In the case of the embodiment 6, because the lead frame 5 is joined with the heat sinks 8, an area for receiving the viscous force of a fluidic resin increases in a transfer molding step. Therefore, because the viscous force for deforming the lead frame 5 is increased, it is necessary to increase the stiffness of the leads 4 in order to prevent the deformation of the lead frame 5 due to increase of the viscous force. In particular, it is necessary that the stiffness of the first lead portion 21 close to the plastic package 10 is increased. However, because the leads 4 (including end leads 4a to 4d) of the semiconductor device 61 have a wide first lead portion 21, the portion 21 has a large stiffness and thereby, the easiness of fabrication of the semiconductor device 61 is not deteriorated. Moreover as the leads 4 have a narrow second lead portion 22, a third lead portion 23 to be soldered, and a gap-controlling portion 9, it is possible to improve the solderability when mounting the semiconductor device 61 on the external substrate 25.

Embodiment 7

The embodiment 7 of the present invention will be described below.

The present inventor et al. performed an experiment for examining whether the solderability was improved by making the sectional area of a second lead portion 22 smaller than that of a first lead portion 21 in order to verify the usefulness of the present invention. In the case of this experiment, because the ratio between the sectional area of the second lead portion 22 whose sectional area was decreased in order to prevent heat release to a plastic package 10 and the sectional area of the third lead portion 23 for directly receiving the quantity of heat from melted solder, that is, the "lead-portion sectional-area ratio" defined by (second lead-portion sectional area/(third lead-portion sectional area) was important, the lead-portion sectional area ratio was used as an experimental parameter.

In the case of this experiment, a semiconductor device used a DIPIPM in which the lead surface is plated with Sn—Cu solder. Moreover, as an external substrate, a printed circuit board made of glass epoxy is used. Furthermore, solder used Sn-3Ag-0.5Cu solder that was the most popular among lead-free solders to perform a flow-soldering experiment. In the case of the flow soldering, the temperature of melted solder was set to a general value of 250° C. Moreover, a preheating condition in a flow-soldering device was decided so that it does not exceed the heat-resistant temperature (normally, 85° C.) of an electrolytic capacitor which is frequently mounted on the same printed circuit board in general. Under the preheating condition, though the surface temperature of the printed circuit board rises up to approx. 150° C., the surface temperature of the DIPIPM rises only up to approx. 50° C. Therefore, a large temperature difference is produced between components. However, this is a limit of an existing flow-soldering device.

By raising the preheating temperature or increasing the preheating time and thereby preheating the DIPIPM so as to have a higher temperature, the temperature of the printed-circuit board is also raised. Therefore, the solderability is improved. However, a problem occurs that the temperature of the printed-circuit board also exceeds the heat-resistant temperature of the electrolytic capacitor. Moreover, even if the electrolytic capacitor is not mounted on the printed-circuit board, the flux used to clean a non-solder-joining face in the soldering process is inactivated by raising the preheating temperature. Therefore, the plastic cannot exhibit its effect under the important soldering process and a problem occurs that the solderability is rather deteriorated. Therefore, when considering the above problem, it is not preferable to set the preheating temperature to a value higher than the above value.

Table 1 shows results of the above experiment. In Table 1, symbols "⊚⊚", "⊚", "○", "Δ", and "x" denote qualities of solderability, in which order a higher solderability is represented. Among these symbols, "⊚⊚", "⊚", and "○" are nondefective levels, that is, levels having no problem on reliability.

Figure 21:
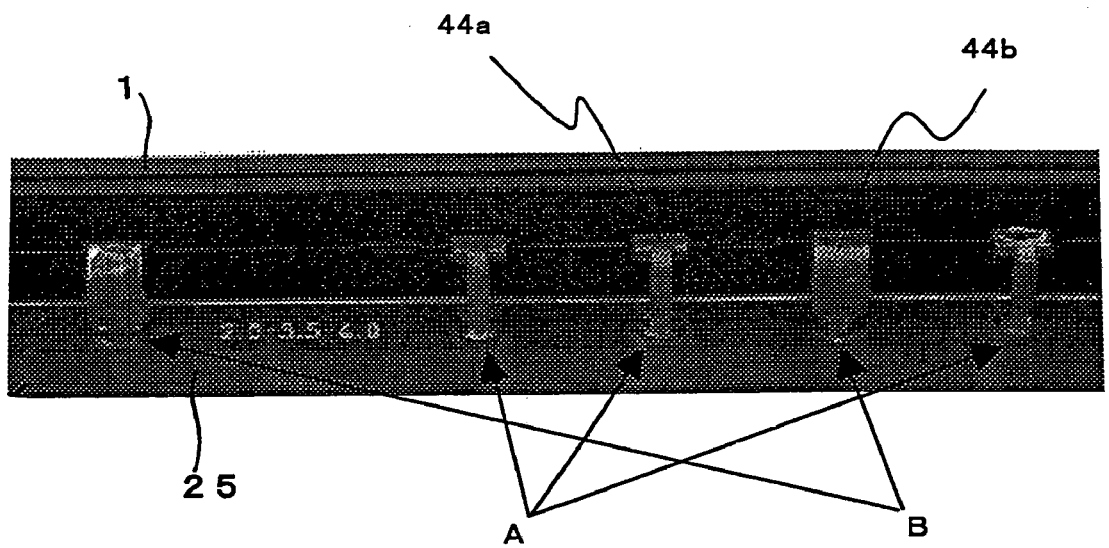
FIG. 21 is a photo showing a joined state of a metal (metallic structure) of a soldered portion between a lead and an external substrate instead of an illustration.

Moreover, in order to show the experiment result with * marks in Table 1 in a easy way to understand, FIG. 21 shows an enlarged photo of soldered portions of a DIPIPM in which a conventional lead 44b (lead sectional-area ratio of 300%) and a lead 44a (lead sectional-area ratio of 125%; hereafter referred to as simulated lead 44a of the present invention) obtained by cutting off a part of the conventional lead 44b and thereby simulating the lead structure of the present invention are mixed. As shown in FIG. 21, in the conventional lead 44b, wet-up of solder is insufficient and the solder is not wet up on the upper face of the through-hole. Therefore, this is not preferable soldering (B). However, in the case of the simulated lead 44a of the present invention, wet-up is sufficient and it is found that preferable soldering is performed (A).

Also in the case of an experiment using Pb—Sn eutectic solder, it is confirmed that the same effect is obtained though the degree of improvement effect is slightly small.

TABLE 1

| | Lead sectional-area ratio | Solderability |
| --- | --- | --- |
| Conventional lead structure | 300% | x* |
| Lead structure of the present invention | 200% | x–Δ |
| ↑ | 175% | ○ |
| ↑ | 150% | ⊚ |
| ↑ | 140% | ⊚ |
| ↑ | 130% | ⊚⊚ |
| ↑ | 120% | ⊚⊚* |
| ↑ | 110% | ⊚⊚ |
| ↑ | 100% | ⊚⊚ |
| ↑ | 75% | ⊚⊚ |

According to the above experiment, in the case of the lead structure of the present invention having the second lead portion 22 having a sectional area smaller than that of the conventional lead structure not having the second lead portion 22, the solderability is improved in the above all samples, that is, it can be said that the effectiveness of the present invention is verified. Moreover, according to the experimental results, it is preferable that the sectional area of the second lead portion 22 is 175% or less of the sectional area of the third lead portion 23 in the lead structure of the present invention. Furthermore, when considering the process margin under the soldering process, it is preferable that the sectional area of the second lead portion 22 is 130% or less of the sectional area of the third lead portion.

Embodiment 8

A semiconductor assembly module of the embodiment 8 of the present invention will be described below by referring to FIG. 22. The semiconductor assembly module 80 of the embodiment 8 is constituted by setting a semiconductor device 1 to an external substrate 25 together with various electronic components.

Figure 22:
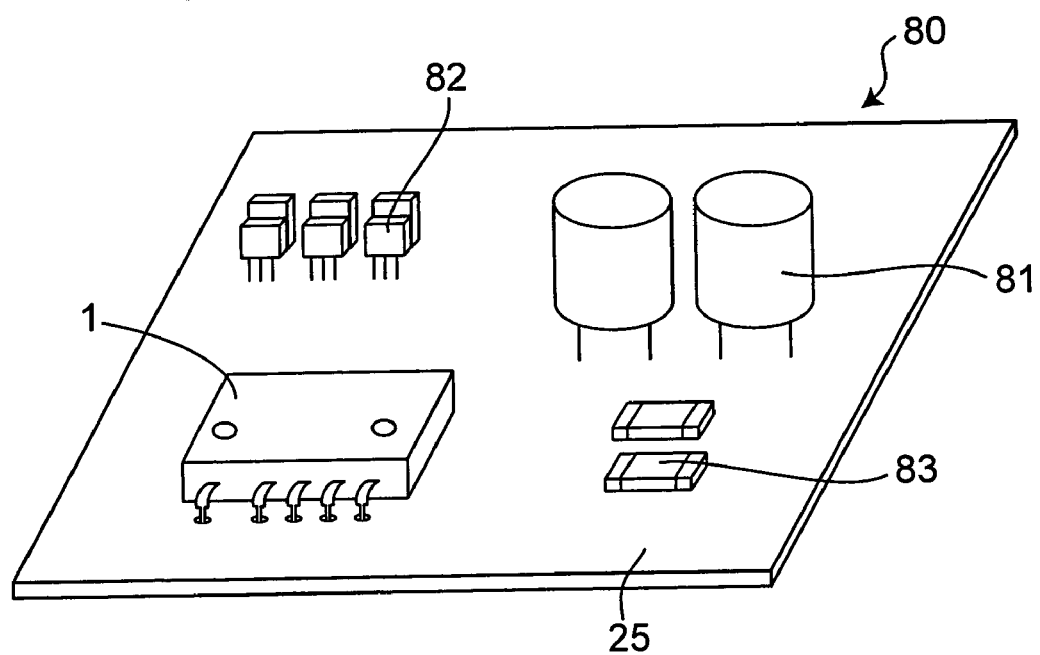
FIG. 22 is a perspective view of a semiconductor assembly module of embodiment 8.
Figure 23:
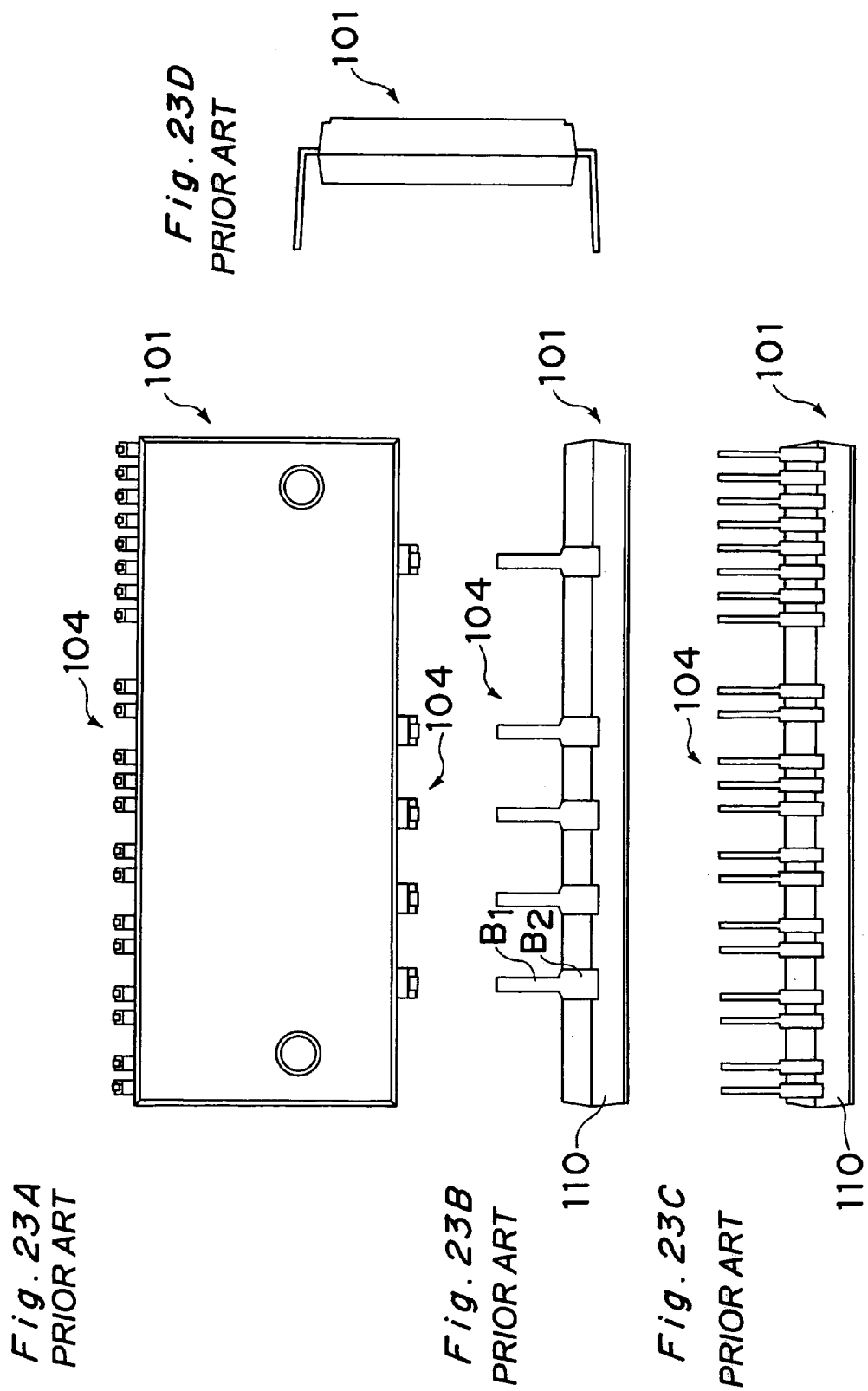
FIGS. 23A–23D are a top view, a front view, a rear view and a side view of a conventional semiconductor device, respectively.
Figure 24:
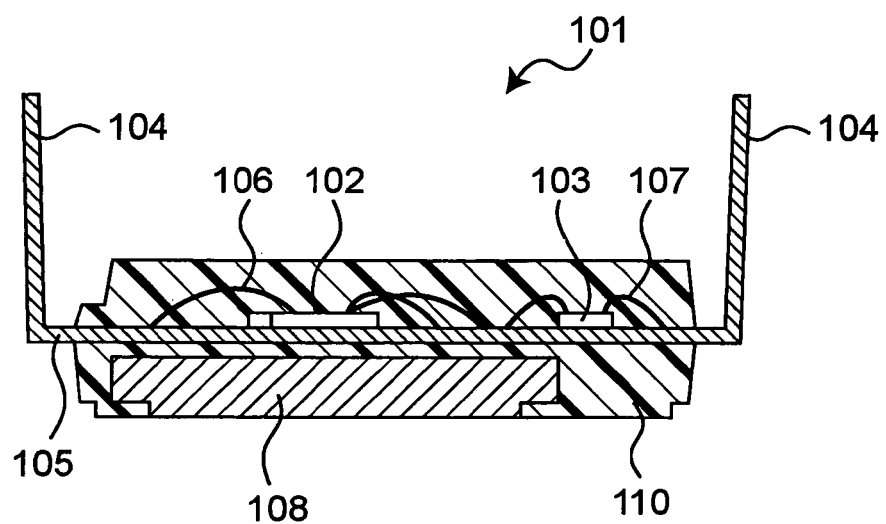
FIG. 24 is a side sectional view of the conventional semiconductor device shown in FIGS. 23A–23D.
Figure 25:
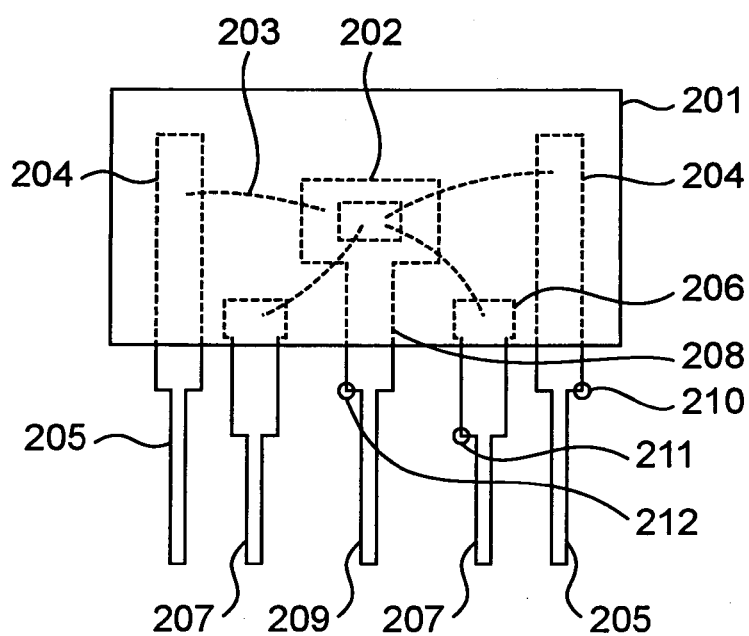
FIG. 25 is a front view showing a configuration of another conventional semiconductor device.

As shown in FIG. 22, in the case of the semiconductor assembly module, the semiconductor device 1 of the present invention is mounted on the external substrate 25 by Pb-free solder (Sn-3Ag-0.5Cu). Moreover, an electrolytic capacitor 81, discrete-type transistor 82, and chip component 83 are mounted on the external substrate 25 in addition to the semiconductor device 1. These electronic components 81 to 83 are mounted on the external substrate 25 together with the semiconductor device 1 of the present invention and thereby, the semiconductor assembly module 80 is formed. By using the semiconductor device 1 of the present invention, the solderability of a lead is improved and various advantages are obtained as described below.

In the case of a semiconductor assembly module using a conventional semiconductor device, because a solder joint between the semiconductor device and an external substrate easily becomes a solder structure having a low reliability, an inspection or repair is indispensable after mounting the semiconductor device on the substrate. However, when using the semiconductor device 1 of the present invention, it is possible to easily obtain the semiconductor assembly module 80 superior in soldered-portion reliability because a preferable solderability is obtained. Therefore, it is possible to reduce the numbers of visual inspecting steps and repairing steps having been performed so far and cut the cost of the semiconductor assembly module 80. Moreover, because the reliability of the semiconductor assembly module 80 is stably highly maintained, it is easy to stably highly maintain the reliability of an end product using the module 80.

In this semiconductor assembly module 80, the number of types of and the number of electronic components to be mounted on the external substrate 25 are not restricted to those illustrated in FIG. 22. Moreover, in this case, a mounting technique using Pb-free solder (Sn-3Ag-0.5Cu) is illustrated which has a remarkable improvement effect of the solderability according to the present invention. However, even when using Pb—Sn eutectic solder, the same advantage can be expected. Therefore, a solder species is not restricted to Pb-free solder. However, it is preferable to use Pb—Sn eutectic solder or solder having a liquidus-line temperature higher than that of the Pb—Sn eutectic solder because the solderability improvement effect is remarkable.

In the case of the semiconductor devices 1, 51, and 61 of the above embodiments, the leads 4 (including end leads 4a to 4d) protrude outward from the side face of the plastic package 10 and are bent midway by approx. 90°. However, in the case of these semiconductor devices 1, 51, and 61, it is allowed that the leads 4 protrude from a portion other than the side face of the plastic package 10, for example, from the upper face of the plastic package 10.

In the case of the semiconductor devices 1, 51, and 61 of the above embodiments, the leads 4 protrude from two side faces of the plastic package 10. However, it is also allowed that the leads 4 protrude from four side faces or from one side face Moreover, in the case of these semiconductor devices 1, 51, and 61, the leads 4 are bent once midway. However, it is allowed that the leads 4 are not bent midway or they are bent twice or more midway as long as they can be inserted into and mounted on the external substrate 25.

When solders used for the above embodiments are restricted to Pb-free solder, any solder based on Sn but excluding Pb can be used. Moreover, when the solders are not restricted, any type of solder can be used. However, as described above, it is preferable to use Pb—Sn eutectic solder or solder having a liquidus-line temperature higher than that of the Pb—Sn eutectic solder because the solderability improvement effect is remarkable.

In the case of the above embodiments, a glass-epoxy printed-circuit board is shown as the external substrate 25. However, the external substrate 25 is not restricted to the glass-epoxy printed-circuit board. It is also allowed to use a printed-circuit board mainly made of paper phenol or composite. Moreover, it is allowed to use an external electric component instead of a substrate as long as the semiconductor device 1, 51, or 61 can be inserted into and mounted on the component.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor device of an insertion-mount-type comprising:
    a plastic package;
    a plurality of leads protruding outward from said plastic package;
    one or more semiconductor elements protected by said plastic package; and
    electric wiring protected by said plastic package to connect said semiconductor elements with said leads, said semiconductor device being mounted on an external electric member by inserting said leads into a lead-inserting portion of said external electric member and joining said leads with said lead-inserting portion by solder, at least one of said semiconductor elements being a power semiconductor element, and each of said leads being coated with solder using tin as a base material without containing lead on outside of said plastic package, wherein
    each of said leads includes a first lead portion located at a plastic package side, a second lead portion located at a position closer to a lead tip end than said first lead portion, and a third lead portion located at a position closer to the lead tip end than said second lead portion, the third lead portion being inserted into said lead-inserting portion,
    the sectional area of said second lead portion is set to a value smaller than that of said first lead portion, and
    at least some of said leads are formed as gap-controlling leads provided with gap-controlling means to keep a gap between said semiconductor device and said external electric member constant by inserting at least some of the third lead portions into said external electric member up to said gap-controlling means, said gap-controlling means being located at a position closer to the lead tip end than said second lead portion and said gap-controlling means having a side surface configured to contact the external electric member but not enter the lead-inserting portion when the third lead portion is inserted into the lead-inserting portion.

2. The semiconductor device according to claim 1, wherein said gap-controlling means is formed by making the lead width thereof locally larger than the width of said second lead portion.

3. The semiconductor device according to claim 2, wherein said leads are arranged in a line at a side portion of said plastic package, only said leads at both ends of said line being formed as said gap-controlling leads.

4. The semiconductor device according to claim 2, wherein the thickness of said first lead portion is equal to that of said second lead portion, the width of said second lead portion being smaller than that of said first lead portion.

5. The semiconductor device according to claim 2, wherein the sectional area of said second lead portion is equal to that of said third lead portion.

6. The semiconductor device according to claim 2, wherein said gap-controlling means is formed in a shape protruding to both directions along a lead width direction.

7. The semiconductor device according to claim 6, wherein the lead width of said gap-controlling means is equal to that of said first lead portion.

8. The semiconductor device according to claim 7, wherein each of said gap-controlling leads is formed by linearly cutting said lead frame having a wide portion corresponding to said first lead portion, a narrow portion corresponding to said third lead portion, and a tie bar portion which connects said wide portion with said narrow portion and in which two holes are formed, and
    both of said holes are located at both sides of a range of said narrow portion along the lead width direction so that said holes are not present in said range, said holes being located on extension lines of both sides of said wide portion.

9. The semiconductor device according to claim 1, wherein said gap-controlling means is formed by forming two or more bent portions on each of said gap-controlling leads.

10. The semiconductor device according to claim 9, wherein said third lead portion is formed in a range in which said first lead portion is formed with respect to a lead width direction, and
    a side of said first lead portion and a side of said third lead portion are located on one straight line at one side in the lead width direction.

11. The semiconductor device according to claim 10, wherein each of said gap-controlling leads is formed by linearly cutting said lead frame having a wide portion corresponding to said first lead portion, a narrow portion corresponding to said third lead portion, and a tie bar portion which connects said wide portion with said narrow portion and in which one hole is formed, and
    said hole is located so as to include a range of said narrow portion in a lead width direction, said hole being located on an extension line of one side of said wide portion without being located on an extension line of the other side of said wide portion.

12. The semiconductor device according to claim 1, wherein in each of said gap-controlling leads, said second lead portion and said gap-controlling means are formed by forming a hole on said lead at a position closer to a tip end than said first lead portion.

13. The semiconductor device according to claim 12, wherein one side of said first lead portion and one side of said second lead portion is located on one straight line, while the other side of said first lead portion and the other side of said second lead portion is located on another straight line.

14. The semiconductor device according to claim 13, wherein each of said gap-controlling leads is formed by linearly cutting said lead frame having a wide portion corresponding to said first lead portion, a narrow portion corresponding to said third lead portion, and a tie bar portion which connects said wide portion with said narrow portion and in which one hole is formed, and said hole is located so as to include a range of said narrow portion in a lead width direction without being located on extension lines of both sides of said wide portion.

15. The semiconductor device according to claim 8, wherein each of said holes is a rectangular hole in which two opposite sides are parallel with the lead width direction or lead extending direction.

16. The semiconductor device according to claim 11, wherein said hole is a rectangular hole in which two opposite sides are parallel with the lead width direction or lead extending direction.

17. The semiconductor device according to claim 14, wherein said hole is a rectangular hole in which two opposite sides are parallel with a lead width direction or lead extending direction.

18. The semiconductor device according to claim 2, wherein each of said gap-controlling leads is formed by linearly cutting said lead frame having a wide portion corresponding to said first lead portion, a narrow portion corresponding to said third lead portion, and a tie bar portion which connects said wide portion with said narrow portion and in which two cutoff are formed at a position closer to said narrow portion, and said cutoffs are located at both sides of a range of said narrow portion in a lead width direction, said cutoffs being located on extension lines of both sides of said wide portion so as to be previously provided with said gap-controlling means.

19. A semiconductor assembly module comprising:

an external electric member; and a semiconductor device according to claim 1 inserted into and mounted on said external electric member by solder.

\* \* \* \* \*